(12) United States Patent
    Kocon

(10) Patent No.: US 10,770,584 B2
(45) Date of Patent: Sep. 8, 2020

(54) DRAIN EXTENDED TRANSISTOR WITH TRENCH GATE

(71) Applicant: Texas Instruments Incorporated, Dallas, TX (US)

(72) Inventor: Christopher Boguslaw Kocon, Mountain Top, PA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/185,679

(22) Filed: Nov. 9, 2018

(65) Prior Publication Data

US 2020/0152788 A1    May 14, 2020

(51) Int. Cl.
| H01L 29/08 | (2006.01) |
| H01L 29/10 | (2006.01) |
| H01L 29/78 | (2006.01) |
| H01L 29/66 | (2006.01) |
| H01L 21/225 | (2006.01) |
| H01L 21/762 | (2006.01) |
| H01L 29/423 | (2006.01) |

(52) U.S. Cl.
CPC ...... *H01L 29/7825* (2013.01); *H01L 21/2253* (2013.01); *H01L 21/76202* (2013.01); *H01L 29/0865* (2013.01); *H01L 29/0882* (2013.01); *H01L 29/1095* (2013.01); *H01L 29/4236* (2013.01); *H01L 29/66659* (2013.01); *H01L 29/66704* (2013.01); *H01L 29/7835* (2013.01)

(58) Field of Classification Search
CPC ............. H01L 29/7825; H01L 29/0865; H01L 29/0882; H01L 29/1095; H01L 29/4236; H01L 29/66659; H01L 29/66704; H01L 29/7835

USPC ......................................................... 257/343
See application file for complete search history.

(56) References Cited

U.S. PATENT DOCUMENTS

| 7,589,378 | B2 | 9/2009 | Kocon et al. |
| 8,288,820 | B2 | 10/2012 | Kocon et al. |
| 8,748,976 | B1 | 6/2014 | Kocon et al. |
| 8,928,075 | B2 | 1/2015 | Kocon et al. |
| 9,230,851 | B2 | 1/2016 | Molloy et al. |
| 9,299,830 | B1 | 3/2016 | Kawahara et al. |
| 9,318,598 | B2 | 5/2016 | Grebs et al. |
| 9,496,388 | B2 | 11/2016 | Grebs et al. |
| 9,583,611 | B2 | 2/2017 | Grebs et al. |
| 9,711,639 | B2 | 6/2017 | Kawahara et al. |
| 9,905,428 | B2 | 2/2018 | Strachan et al. |
| 2009/0256212 | A1* | 10/2009 | Denison ............. H01L 29/0653 257/408 |
| 2011/0127602 | A1* | 6/2011 | Mallikarjunaswamy .................... H01L 21/823807 257/331 |
| 2015/0349112 | A1 | 12/2015 | Grebs et al. |

(Continued)

*Primary Examiner* — Long K Tran
(74) *Attorney, Agent, or Firm* — Jacqueline J. Garner; Charles A. Brill; Frank D. Cimino

(57) ABSTRACT

A semiconductor device includes a semiconductor substrate with a trench, a body region under the trench with majority carrier dopants of a first type, and a transistor, including a source region under the trench with majority carrier dopants of a second type, a drain region spaced from the trench with majority carrier dopants of the second type, a gate structure in the trench proximate a channel portion of a body region, and an oxide structure in the trench proximate a side of the gate structure.

16 Claims, 27 Drawing Sheets

(56) References Cited

U.S. PATENT DOCUMENTS

2016/0240653 A1    8/2016   Kocon et al.
2017/0025525 A1    1/2017   Kocon et al.
2017/0062573 A1    3/2017   Kocon et al.
2017/0222041 A1    8/2017   Kawahara et al.
2017/0288052 A1   10/2017   Kawahara et al.
2018/0226502 A1    9/2018   Kawahara et al.

\* cited by examiner

DRAIN EXTENDED TRANSISTOR WITH TRENCH GATE

BACKGROUND

High efficiency power supplies are desirable for battery-operated systems, including mobile phones, tablets, laptops and other user devices. Increased power density, reduced circuit size, and lowered costs are desired properties of switching converters for many such applications. Many DC to DC converter topologies, such as buck, boost, buck-boost, cuk and other configurations, use high and low side transistor switches or drivers to alternately connect a switching node to the input voltage or ground. Switching converter efficiency is largely influenced by switching losses and conduction losses. Laterally diffused MOS (LDMOS) transistors are a type of extended drain transistor (e.g., DEMOS) sometimes used in power switching circuits and other applications in which high voltage transistors are integrated with logic and other low voltage transistors on a single integrated circuit (IC). DEMOS transistors are also available as stand-alone transistor products for use in constructing switching power supplies. LDMOS improvements are desired to further improve efficiency, increase switching frequency, and to reduce size and system cost.

SUMMARY

Described examples include semiconductor devices that include a semiconductor substrate with a trench, a body region under the trench with majority carrier dopants of a first type. The electronic device includes a transistor having a source region under the trench with majority carrier dopants of a second type, a drain region spaced from the trench with majority carrier dopants of the second type, a gate structure in the trench proximate a channel portion of a body region, and an oxide structure in the trench. Some examples include standalone transistor semiconductor devices with a single transistor. Other examples provide integrated circuits with multiple transistors. In some examples, the gate-drain lateral spacing dimension is different for different transistors in the device to provide transistors of different voltage ratings for the same or similar trench depths and drift region doping profiles.

Further examples include a transistor with a source region under a trench of a semiconductor substrate adjacent a channel portion of a body region, in which the body region includes majority carrier dopants of a first type, and the source region includes majority carrier dopants of a second type. The transistor also includes a drain region spaced from the trench in the semiconductor substrate with majority carrier dopants of the second type, a drift region with majority carrier dopants of the second type between the channel portion of the body region and the drain region, as well as a gate structure in the trench, and an oxide structure in the trench between a side of the gate structure and the drift region.

Further aspects of the disclosure provide a method to fabricate a semiconductor device, which includes forming a trench in a semiconductor substrate, forming a gate structure in the trench proximate a channel portion of a body region implanted with majority carrier dopants of a first type, and performing an implantation process that implants dopants of a second type under the trench to form a source region adjacent the channel portion of the body region. The method also includes performing another implantation process that implants dopants of the second type to form a drain region spaced from the trench in the semiconductor substrate, and forming an oxide structure in the trench proximate a side of the gate structure.

DETAILED DESCRIPTION

Figure 1:
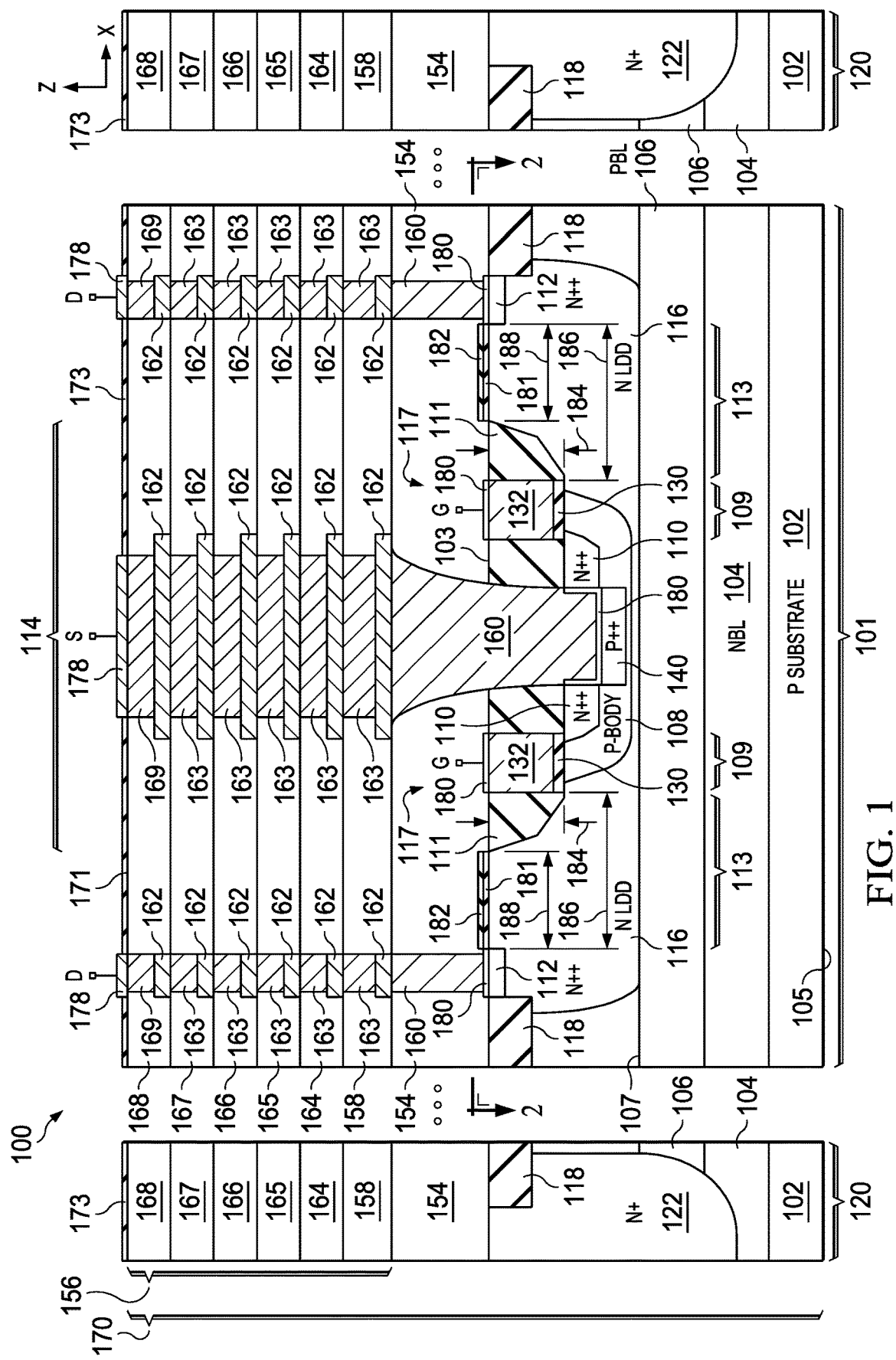
FIG. 1 is a partial sectional side elevation view of an integrated circuit semiconductor device that includes a recessed drain extended transistor with a trench gate and local oxidation of silicon (LOCOS) oxide structures.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections. The various features of the disclosed examples can be used in connection with a variety of different semiconductor devices, including without limitation integrated circuits having multiple electronic components, as well as single component semiconductor devices (e.g., single transistor products, single diode products, etc.).

Figure 2:
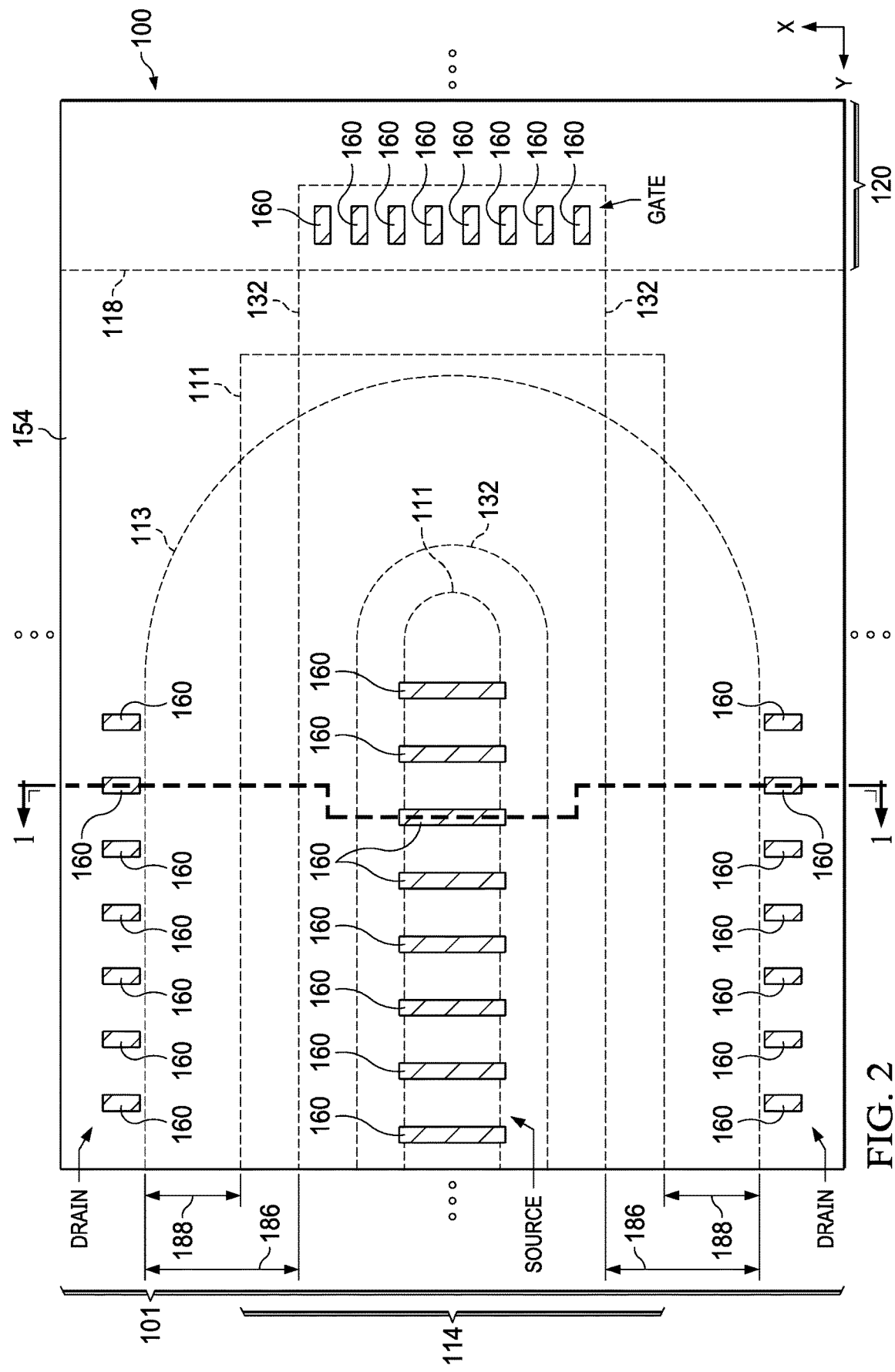
FIG. 2 is a partial sectional top plan view of the integrated circuit along line 2-2 of FIG. 1.
Figure 3:
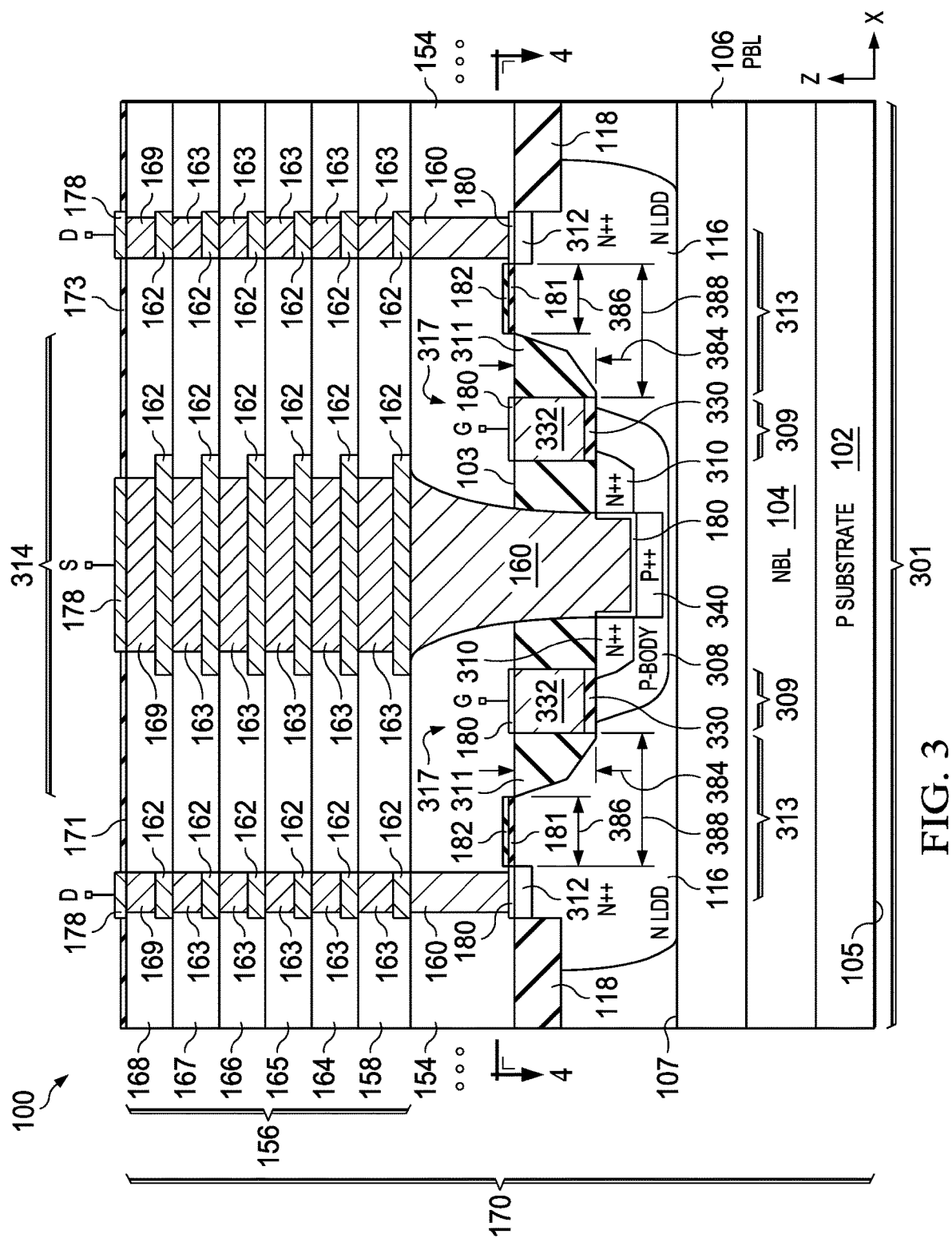
FIG. 3 is a partial sectional side elevation view of another drain extended transistor with a trench gate in the semiconductor device of FIGS. 1 and 2.
Figure 4:
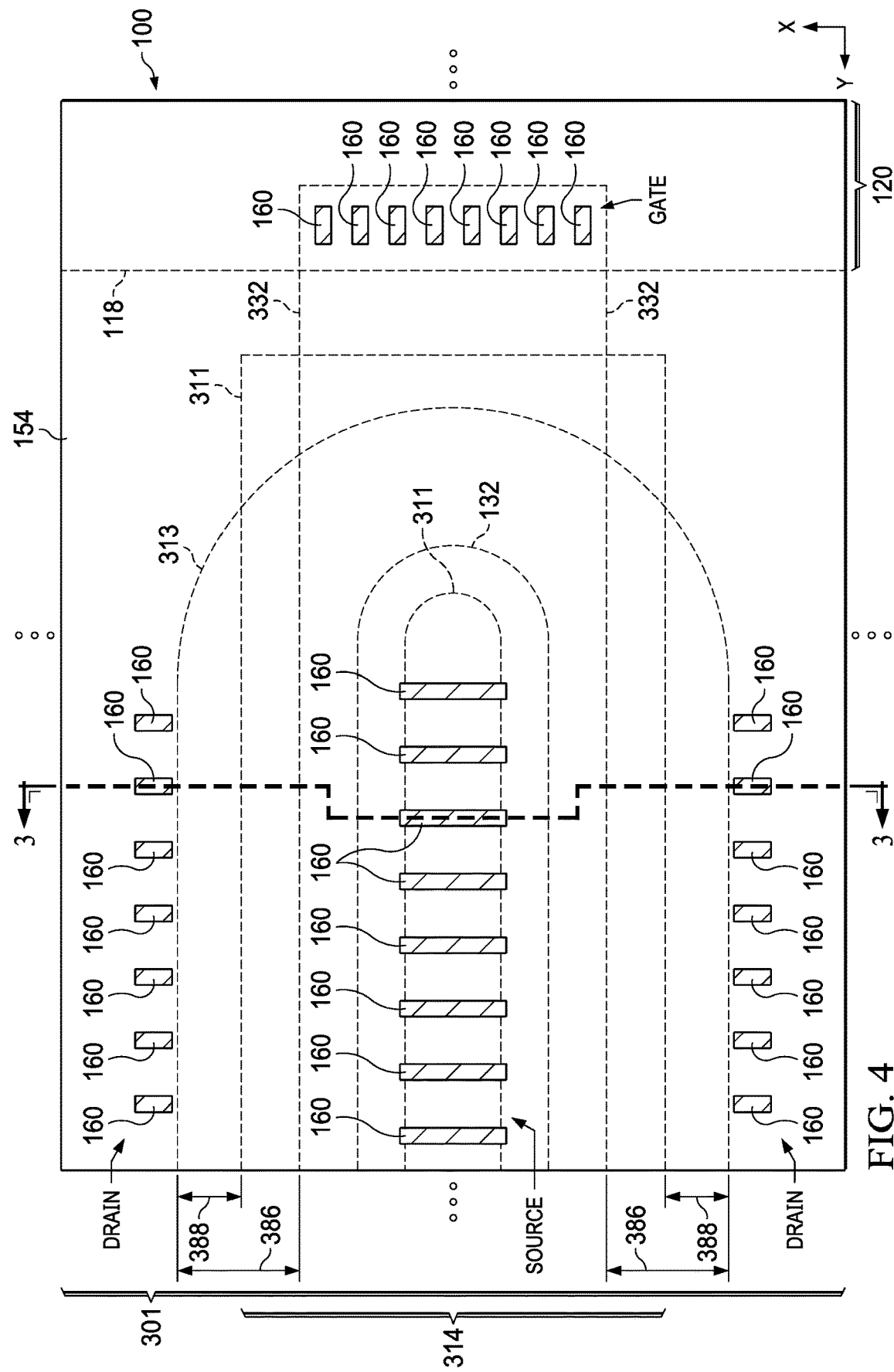
FIG. 4 is a partial sectional top plan view of the integrated circuit along line 4-4 of FIG. 3.

Referring initially to FIGS. 1-4, FIG. 1 shows an integrated circuit semiconductor device 100 that includes a recessed drain extended MOS (DEMOS) transistor 101 with a trench gate and local oxidation of silicon (LOCOS) oxide structures. The example transistor 101 provides a gate structure in a recessed trench with a drift region that eliminates a p-body corner and mitigates channel hot carrier degradation of the gate. Other examples provide trench gate NMOS transistors without extended drain structures. The example IC 100 also includes an additional transistor as shown in FIGS. 3 and 4 with a different voltage rating using different LDD-drift region critical dimensions with the same trench depth and drift region doping to facilitate economical fabrication of ICs with multiple transistors of different voltage ratings using a streamlined fabrication process. Disclosed examples can also include stand-alone discrete transistor semiconductor devices that include a single transistor. The transistor 101 in FIG. 1 has multiple gate and drain finger structures surrounding a center source structure. This example provides a pair of gate finger structures in a shared trench on laterally opposite sides of a laterally centered source region implanted below the trench, although not a requirement of all possible implementations.

The trench gate aspects of the transistor 101 can be implemented in combination with any type or form of transistor, such as MOS transistors. In addition, various aspects of the disclosed examples provide benefits in combination with drain extended MOS transistors, although not a requirement of all possible implementations. Described examples include doped regions of various semiconductor structures which may be characterized as p-doped and/or n-doped regions or portions, and include regions that have majority carrier dopants of a particular type, such as n-type dopants or p-type dopants. The illustrated transistor 101 is an n-channel drain extended transistor (e.g., DENMOS). Other implementations are possible within the scope of the present disclosure, including p-channel drain extended transistor examples (e.g., DEPMOS) using oppositely doped structures and regions. Drain extended transistors can include drain-extended NMOS (DENMOS), drain-extended PMOS (DEPMOS), and/or laterally diffused MOS (LDMOS) transistors, as well as groups of DENMOS and DEPMOS, referred to as complimentary drain extended MOS or DECMOS transistors.

The transistor 101 is fabricated on and/or in a semiconductor substrate 102, with a gate structure formed in a trench. The semiconductor substrate 102 in one example is a silicon wafer, a silicon-on-insulator (SOI) substrate or other semiconductor structure. In one example, the substrate 102 is a p-doped silicon substrate or wafer, with a first (e.g., top) side 103, various buried layers 104, 106 formed therein, and a second (e.g., bottom) side 105. In another possible implementation, the substrate 102 includes one or more epitaxial silicon layers (not shown) formed on a top surface, with one or more of the buried layers 104, 106 formed in epitaxial layers of the substrate. The illustrated substrate 102 includes a first doped layer 106 that includes p-type majority carrier dopants. In one implementation, the p-type layer includes a portion implanted with boron to form a p-type buried layer (sometimes referred to as a PBL) with an upper or top side 107, and a further portion, e.g. a lightly-doped p-type epitaxial layer, that extends over (e.g., directly on) the p-type buried layer to form the first or upper side 103 and to provide a composite p-doped first layer 106.

The example substrate also includes a second doped layer 104 (e.g., an n-type buried layer, sometimes referred to as an NBL) that includes n-type majority carrier dopants. The second doped layer 104 extends along a first direction (e.g., the vertical Z direction in FIG. 1) from beneath the first doped layer 106 toward the second side 105. In one example, a first epitaxial silicon layer is formed over the upper surface of a silicon wafer, and all or a portion of the first epitaxial layer is implanted with n-type dopants (e.g., phosphorus, etc.) to form the n-type buried layer. In this example, a second epitaxial silicon layer is formed over the first epitaxial layer, and all or a portion of the second epitaxial layer is implanted with p-type dopants (e.g., boron, etc.) to form the p-type buried layer with the upper side 107. In one example, the PBL region is formed using ion implantation through the final silicon surface (e.g., the top of the second epitaxial layer), with a depth set by using a high implantation energy.

The transistor 101 is an n-channel MOS transistor with a source-centered finger configuration. In other examples, a p-channel drain extended transistor (e.g., a DEPMOS) can be constructed, having oppositely doped structures and regions. The example transistor 101 includes a body region 108 having p-type majority carrier dopants (e.g., referred to as a P-BODY). The body region 108 extends along the Z direction into the p-type layer 106 from the first side 103. The body region 108 includes a channel portion 109 on either side of the center source. The individual channel portions 109 are recessed (e.g., vertically spaced along the negative Z direction) from the top side 103 of the substrate 102. The semiconductor substrate includes a trench (e.g., recessed portion) 114 that extends inward from the top side 103 of the semiconductor substrate. The transistor 101 also includes a source region 110 (referred to as a source) that extends downward along the negative Z direction into the first doped layer 106 from the bottom of the trench 114 of the substrate. The body region 108 extends partially under the trench 114 in the semiconductor substrate 102. The source region 110 extends laterally along a second direction (e.g., the X direction in FIG. 1) adjacent a first (e.g., inner) side of the each of the channel portions 109 of the body region 108. The source region 110 in the illustrated n-channel transistor includes n-type majority carrier dopants (e.g., labeled N++ in the drawings).

The transistor 101 in FIG. 1 has an extended drain structure that includes an oxide structure 111 (e.g., LOCOS or field oxide) that extends along the first side 103 and downward within the trench 114 to provide a field gap for an extended drain that is at least partially laterally diffused. The example source-centered transistor 101 includes a lightly-doped drain implanted region 116 (e.g., labelled NLDD) implanted with phosphorus or other n-type impurities. The transistor 101 also includes gate structures 117 and drain regions 112, respectively, that extend laterally around the source 110, where the source and gate structures are vertically recessed in the trench 114, although not a requirement of all possible implementations. The oxide structure 111 extend in the trench on each lateral side of the gate structures 117 from a first end or edge (e.g., an inner end or edge) spaced along the X direction from the channel portion 109 of the body region 108 to a second (e.g., outer) end that extends outward toward a corresponding drain region 112 (referred to as a drain).

The drain regions 112 are spaced apart from the trench 114 in the semiconductor substrate 102, and include n-type majority carrier dopants. The drain regions 112 extend downward in FIG. 1 along the Z direction into the first doped layer 106 from the first side 103 of the substrate, and are laterally spaced from the trench 114. The individual drain regions 112 have a first end adjacent the second end of the oxide structure 111 and include n-type majority carrier dopants (e.g., labeled N++ in the drawings). In the illustrated example of FIGS. 1-4, the field oxide structure 111 is a local oxidation of silicon (LOCOS) structure.

The extended drain structure includes a drift region 113 with n-type majority carrier dopants. The drift region 113 extends between the channel portion 109 of the body region 108 at the bottom of the trench 114, and the drain region 112 at the tope side 103. The drift region 113 in one example extends along the Z direction into the first doped layer 106 from the first side 103, and extends laterally along the X direction from the channel portion 109 of the body region 108 to the drain region 112. In certain examples, the dopant concentration of the drift region 113, and concentrations of other regions in the IC 100, can be profiled and can vary within a range. The oxide structure 111 extends laterally in the trench 114 between an outer side of the gate structure 117 and the drift region 113. In one example, all or at least a portion of the oxide structure 111 extends between the drift region 113 and the first side 103 along the Z direction.

The individual gate structures 117 include a gate dielectric layer 130 in the trench 114 proximate the channel portion 109 of the body region 108, and a gate electrode 132 on the gate dielectric layer 130 in the trench 114. The example gate structures 117 extend at least partially over the corresponding channel portions 109 of the body region 108. The illustrated IC 100 further includes isolation features, including an outer oxide structure 118 that encircles the transistor 101 along the first (e.g., top) side 103. The oxide structure 118 in one example is a shallow trench isolation (STI) structure, which is disposed laterally outward of the outermost drain regions 112. In the illustrated example, the STI structure 118 defines an end of an active region of the semiconductor substrate 102 in which the transistor 101 is formed.

The STI structure 118 in one example is adjacent to an isolation structure 120 that encircles or surrounds the transistor 101 and the active region of the IC 100. The isolation structure 120 includes a deep n-doped region 122 (e.g., labeled N+ in FIG. 1) that extends laterally outward of the active region. In another implementation, the isolation structure can be a deep trench structure with doped sidewall structures (not shown) that extend from the top side 103 of the substrate 102 through the PBL region 106, and into the NBL region 104. In certain examples, the isolation structure includes sidewall structures (not shown) on opposite lateral sides of deposited field oxide structures (not shown) that extend into the lower portion of the p substrate 102 beneath the NBL layer 104. As seen in FIGS. 1-4, the example transistor 101 includes finger structures that extend along a finger direction (e.g., along the Y direction in FIGS. 2 and 4), in which the gate structure 117 laterally encircles the source region 110. The illustrated gate structure 117 includes a gate dielectric layer 130 formed over the channel 109 at the bottom of the trench 114 of the substrate 102. The gate structure 117 also includes a patterned gate electrode 132 (e.g., polysilicon) on the gate dielectric layer 130, and may include lateral sidewall spacers (not shown) along lateral sides of the patterned gate electrode 132. The example transistor 101 also includes a p-type body contact region 140 laterally adjacent to the source region 110 to provide an electrical connection to the body region 108 (labeled P++ in FIG. 1).

The IC 100 also includes a metallization structure with a first dielectric structure layer 154 formed over the substrate 102, as well as a multi-level upper metallization structure 156. In one example, the first dielectric structure layer 154 is a pre-metal dielectric (PMD) layer disposed over the transistor 101 and the upper surface of the substrate 102. For brevity the first dielectric structure layer 154 may be referred to as the PMD layer 154. In one example, the PMD layer 154 includes silicon dioxide ($SiO_2$) deposited over the transistor 101, the substrate 102 and the isolation structures 118. The PMD layer 154 includes contact structures 160 (sometimes referred to as contacts, e.g., Tungsten) that provide direct electrical connection to one or more features of the transistor 101. The PMD layer 154 and the upper metallization structure 156 cover the transistor 101 and provide internal and/or external electrical interconnection to the transistor source, drain and gate terminals, respectively designated S, D and G in FIG. 1. The PMD layer 154 is formed over the illustrated structure, with contacts 160 formed therein to provide electrical interconnection access for one or more further upper metallization layers 158 and 164-168. As used herein, the source, drain and gate contact features of the transistor include associated silicide 180 (e.g., $CoSi_2$) or other conductive surface features that provide electrical connection to the associated source regions 110, drain regions 112, and gate electrode structures 132. In one example, a silicide 180 is formed over the top surfaces of the source regions 110, the drain regions 112, and the gate electrodes 132. The PMD layer contact structures 160 in one example are tungsten contact plugs that directly contact the silicide 180 of the associated features and regions of the transistor 101.

The upper metallization structure 156 includes one or more layers. In one example, the upper metallization structure 156 includes one or more conductive structures or features that are directly connected to the source region 110 or the drain region 112 to form an integrated capacitor between the source region 110 and the drain region 112. In the illustrated example, the upper metallization structure 156 includes the first metallization layer 158 formed over the PMD layer 154, as well as further metallization layers 164, 165, 166, 167, and 168 progressively formed over the preceding layer as shown in FIG. 1. The IC 100 in FIG. 1 is shown as a wafer 170 prior to singulation and packaging, but the illustrated structure represents the described features after separated as a die for packaging. Although the example die 170 is an integrated circuit with multiple components, such as transistors 101 and 301 (FIG. 3 below) for a switching DC-DC converter chip, other stand-alone discrete semiconductor device implementations can include a single transistor or other electronic component.

The example die 170 of FIG. 1 includes a 6 layer upper metallization structure 156 with the first metallization layer 158, sometimes referred to herein as an interlayer or inter-level dielectric (ILD) layer. Different numbers of layers can be used in different implementations. In one example, the first ILD layer 158, and the other ILD layers of the upper metallization structure 156 are formed of silicon dioxide ($SiO_2$) or other suitable dielectric material. In certain implementations, the individual layers of the multi-layer upper metallization structure 156 are formed in two stages, including an intra-metal dielectric (IMD, not shown) sub layer with conductive metal routing features or line segments 162 (e.g., aluminum, copper, etc.), and an ILD sublayer overlying the IMD sub layer with conductive vias 163 (e.g., tungsten or copper). The individual IMD and ILD sublayers can be formed of any suitable dielectric material or materials, such as $SiO_2$-based dielectric materials. Tungsten or other conductive contacts 160 extend through selected portions of the PMD layer 154 to make direct contact with the source region 110 or the drain region 112 (e.g., including any silicide thereof). The source contact structure 160 in this example also extends through the LOCOS oxide structure 111 and through a portion of the bottom of the trench 114 to provide a contact to the n-type source region 110 and the p-type body contact region 140.

The first ILD layer 158, and the subsequent layers in the upper metallization structure 156 include conductive line segments 162 formed on the top surface of the underlying layer. In this example, the first ILD layer 158 and the subsequent ILD layers also include conductive vias 163, such as tungsten or aluminum that provide electrical connection from the line segments 162 of an individual layer to an overlying metallization layer. The example of FIG. 1 includes a second layer 164 disposed over the first layer 158. The ILD layer 158 includes conductive interconnect structures 162 and vias 163. The structures 162, 163 can be the same metal or different metals in various implementations. The individual layers can be constructed using any suitable metallization fabrication processing, such as single damascene or dual damascene processes. The illustrated structure includes further metallization levels with corresponding dielectric layers 165, 166 and 167, as well as an uppermost or top metallization layer 168. The individual layers 165-168 in this example include conductive interconnect structures 162 and associated vias or contact plugs 163.

The substrate 102, the electronic components (e.g., the transistor 101), the first dielectric structure layer 154 and the upper metallization structure 156 form a wafer or die 170 with an upper side or surface 171. The upper side 171 of the metallization structure 156 forms an upper side of the wafer or die 170. The top metallization layer 168 includes conductive features 169, such as upper most aluminum vias. The conductive features 169 include a side or surface at the upper side 171 of the wafer or die 170 at the top of the uppermost metallization layer 168. Any number of conductive features 169 may be provided. One or more of the conductive features 169 can be electrically coupled with an electronic component such as the transistor 101.

The upper ILD dielectric layer 168 in one example is covered by one or more passivation layers 173 (e.g., protective overcoat (PO) and/or passivation layers), for example, silicon nitride (SiN), silicon oxynitride (SiO$_x$N$_y$), or silicon dioxide (SiO$_2$). In one example, the passivation layer or layers 173 include one or more openings that expose a portion of the conductive features 169 to allow electrical connection of the features 169 to corresponding contact structures 178. The example wafer or die 170 includes multiple conductive contact structures 178, including connections for the transistor source S and drain D and gate contact structures G (not shown). The contact structures 178 extend outward (e.g., upward along the "Z" direction in FIG. 1) from the upper side 171 of the metallization structure 156.

The individual contact structures 178 are electrically coupled with a corresponding one of the conductive features 169. The individual contact structures 178 in one example include a conductive seed layer, such as copper that extends outward from the upper side 171 of the metallization structure 156. In one example, the contact structure 178 includes titanium (Ti) or titanium tungsten (TiW). The example IC 100 includes a thermal oxide 181 formed over the top side 103 of a portion of the substrate, and a nitride hard mask layer 182 overlying the oxide layer 181. The layers 181 and 182 extend laterally outward from the trench 114 to the drain regions 112.

FIG. 2 shows a top view of a portion of the first drain extended transistor 101 with the source centered configuration. FIGS. 1 and 2 show a portion of a first drain extended transistor 101, and FIGS. 3 and 4 show another portion of the example IC with a second drain extended transistor 301. The first trench 114 of the first transistor 101 (FIGS. 1 and 2) has a non-zero depth 184. The first drain region 112 is spaced from the first gate structure 117 by a first distance 186, and the edge of the first trench 114 is laterally spaced along the X direction from the first drain region 112 by a distance 188. In practice, the gate-drain spacing distance 186 (and the distance 188) can be adjusted to set a voltage rating of the transistor 101 and to provide multiple voltage rating transistors in the IC 100 with different gate-drain spacing distances for a constant trench depth and drift region doping profile. This facilitates economical fabrication of ICs having drain extended transistors of different voltage ratings with a streamlined fabrication process.

As shown in FIGS. 3 and 4, the IC 100 includes a second drain extended transistor 301, generally similar to the first transistor 101, but with different gate-drain spacing dimensions to provide a different (e.g., lower) voltage rating. In one example, the second transistor 301 is formed within a second isolation structure 120 in a separate active region isolated from the active region of the first transistor 101. The semiconductor substrate 102 includes a second trench 314 in the second active region that extends inward from the top side 103 of the semiconductor substrate 102. A second body region 308 is implanted with p-type majority carrier dopants under the second trench 314 in the substrate 102.

The second drain extended transistor 301 includes a second source region 310 with n-type majority carrier dopants under the second trench 314 adjacent a second channel portion 309 of the second body region 308. A second drain region 312 with n-type majority carrier dopants is spaced from the second trench 314 in the semiconductor substrate 102. The second transistor 301 also includes a second drift region 313 with n-type majority carrier dopants between the second channel portion 309 and the second drain region 312. The second transistor 301 also includes a second gate structure 317 with a second gate dielectric layer 330 in the second trench 314 proximate the second channel portion 309 of, and a second gate electrode 332 on the second gate dielectric layer 330 in the second trench 314. A second oxide structure 311 is disposed in the second trench 314 between a side of the second gate structure 317 and the second drift region 313.

The second trench 314 of the second transistor 301 in FIGS. 3 and 4 has a non-zero depth 384. In one example the first and second trench depths 184 and 384 are the same, although not a requirement of all possible implementations. The second drain region 312 is spaced from the second gate structure 317 by a second distance 386, and the edge of the second trench 314 is laterally spaced along the X direction from the second drain region 312 by a distance 388. In one example, the first distance 186 is different than the second distance 386, although not a requirement of all possible implementations. In one example, the first drift region 113 and the second drift region 313 have the same doping profile of n-type majority carrier dopants, although not a requirement of all possible implementations.

Figure 5:
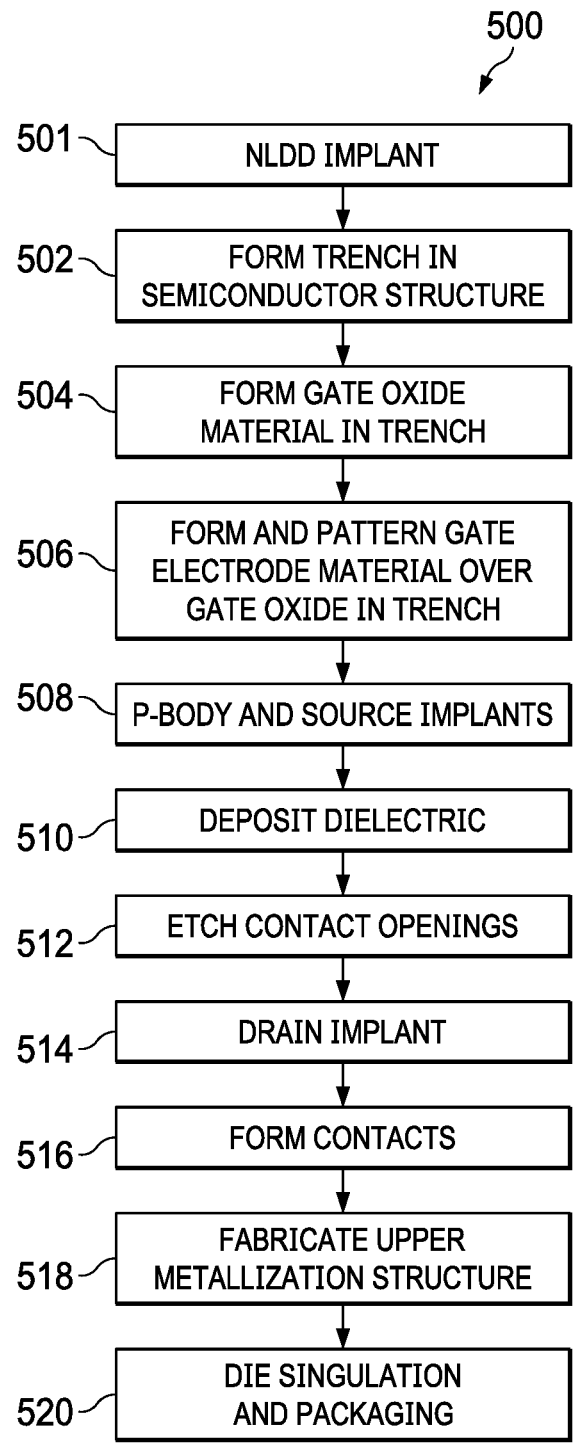
FIG. 5 is a flow diagram showing a method for making a semiconductor device with a trench gate transistor.

FIG. 5 shows a method 500 to fabricate an electronic device, such as an integrated circuit 100 or standalone electronic device having a MOS transistor (e.g., a drain extended transistor 101 as illustrated and described above). The method 500 includes transistor fabrication to build one or more transistors on and/or in a semiconductor structure to produce an integrated circuit with multiple electronic components, a stand-alone transistor device or other semiconductor device. In one drain-extended transistor example, the illustrated method 500 demonstrates fabrication of a recessed LDMOS transistor 101 (referred to as a trench gate drain extended must transistor) in an integrated circuit fabrication flow using LOCOS oxide formation processing.

Figure 6:
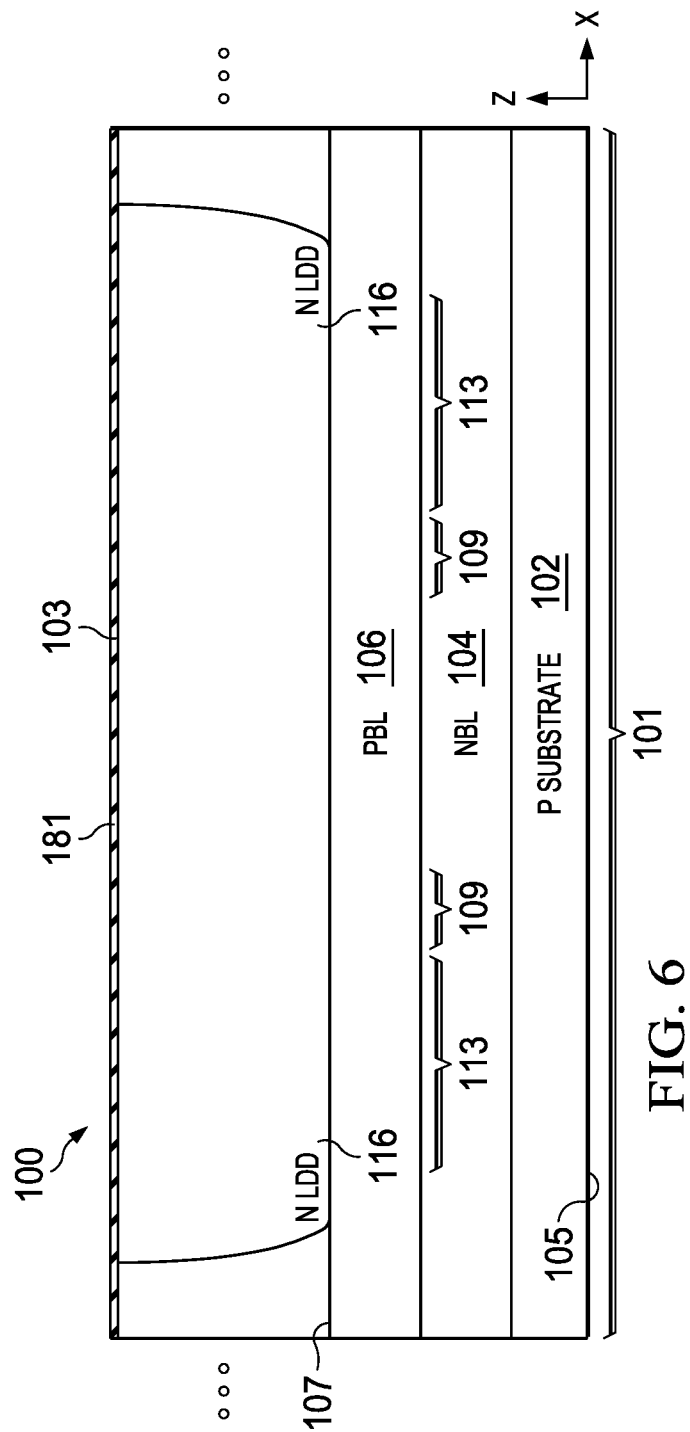
FIGS. 6-21 are partial sectional side elevation views of the integrated circuit of FIGS. 1-4 undergoing fabrication processing according to the method of FIG. 5.

The example fabrication method 500 begins at 501 with an n-type implantation to form an n-doped region, such as the NLDD region 116 in FIG. 1. FIG. 6 shows one example, in which a thermal oxide 181 is formed on the tope side 103 and an implantation process (not shown) is performed that implants phosphorus or other n-type impurities (e.g., dopants) into the top side 103 of the substrate 102, 104, 106 to form the NLDD region 116. In one example, the implantation forms the region 116 to extend downward to the NBL layer 104, although not a requirement of all possible implementations. The further implantation process at 501 implants the n-dopants into the semiconductor substrate 102 to form a prospective drift region 113 (e.g., FIG. 1 above) between the prospective channel portion 109 of the prospective body region 108 and the prospective drain region 112.

Figure 7:
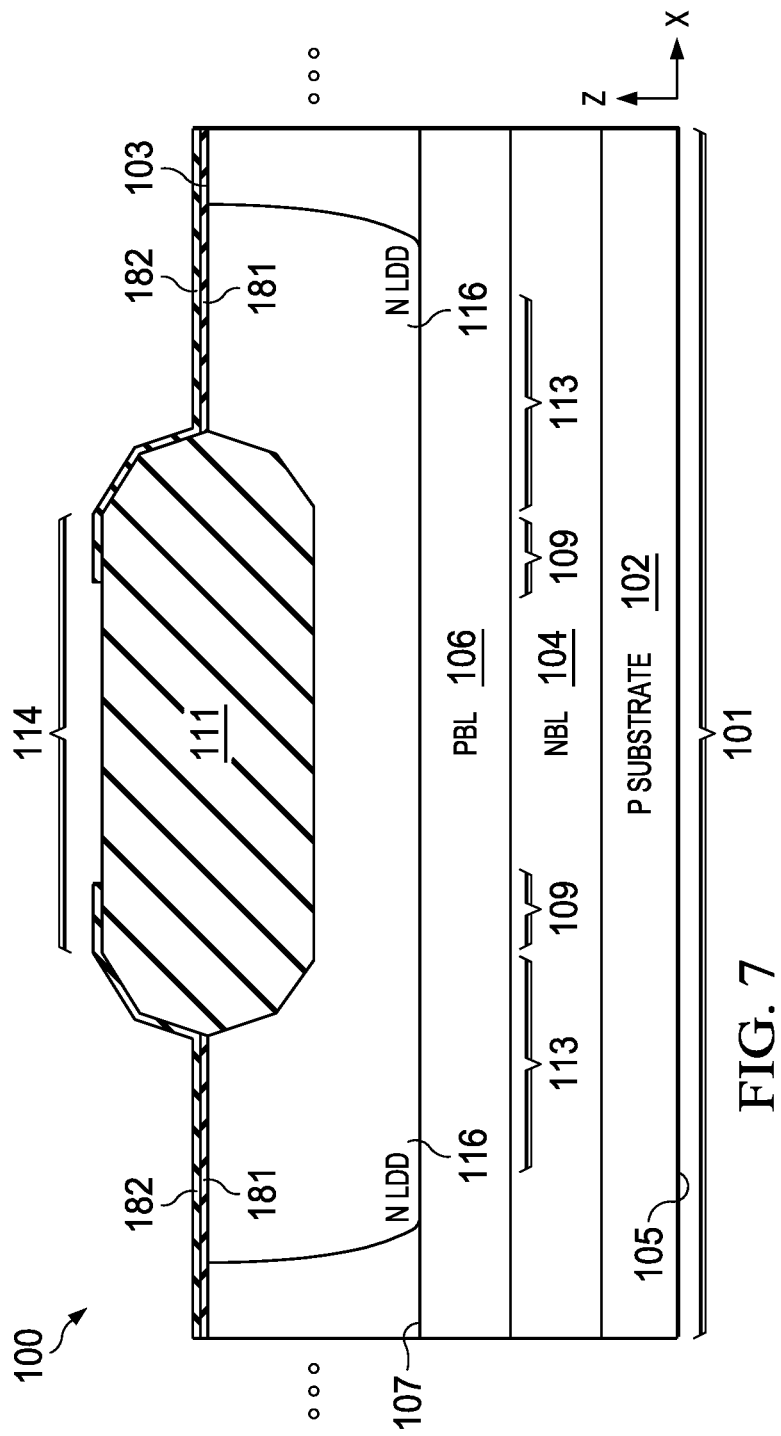
Figure 8:
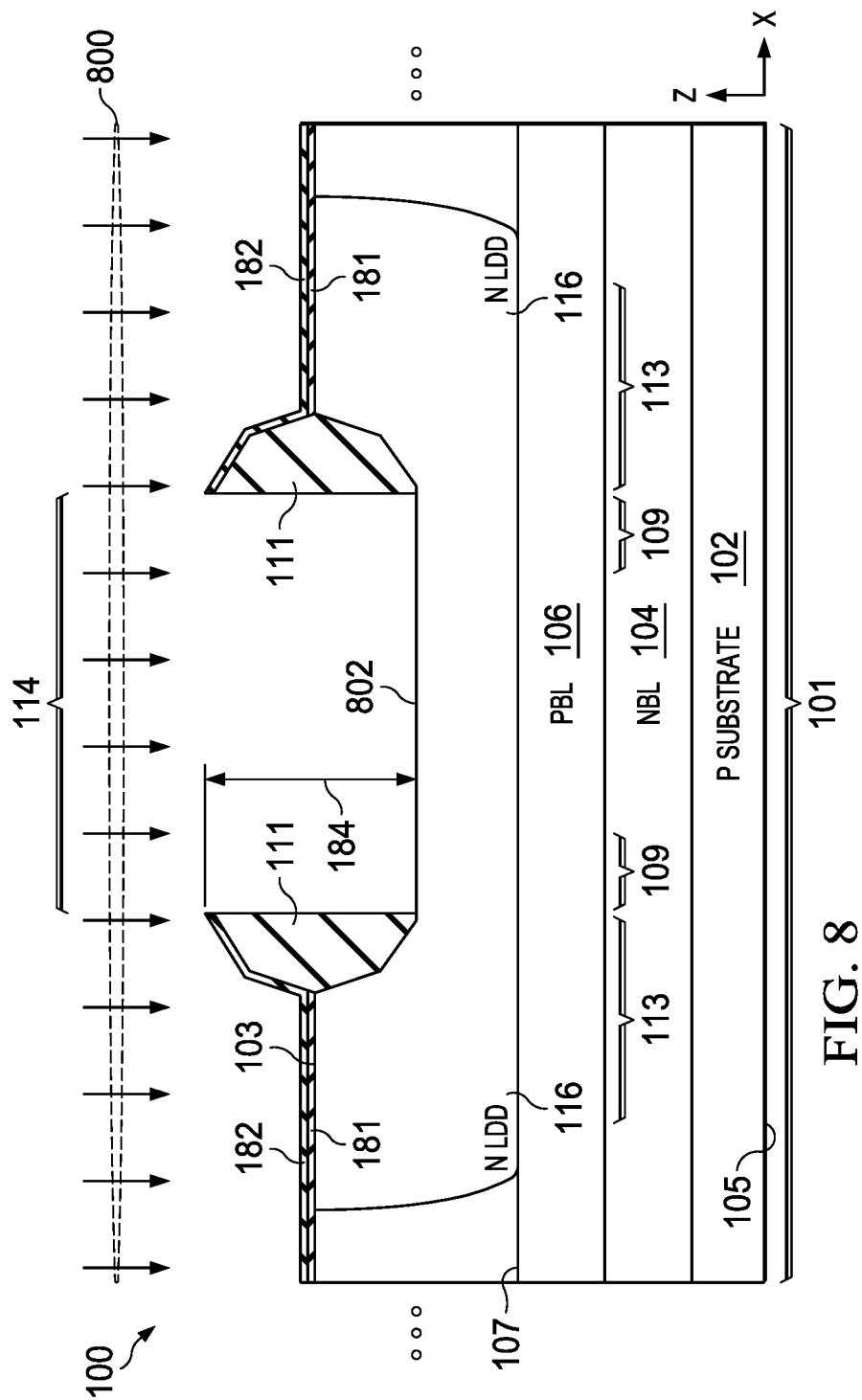

The method 500 also includes forming a trench at 502 in FIG. 5. FIGS. 7 and 8 show one example, in which a local oxidation of silicon process (not shown) is performed to form a LOCOS oxide structure 111 in a prospective trench region 114 of the top side 103. A nitride hard mask layer 182 is deposited and patterned, as shown in FIG. 7. The oxidation process forms the oxide structure 111 in the prospective trench 114 proximate a side of a prospective gate structure 117 that will extend between the side of the subsequently formed gate structure 117 and the drift region 113 of the finished transistor 101. The local oxidation of silicon material of the substrate in this example creates the oxide structure 111 that extends both above and below the top side 103. An etch process 800 is performed in FIG. 8 that selectively removes all or a portion of the exposed oxide material 111 to form the trench 114 that extends inward from the top side 103 of the semiconductor substrate. In the illustrated example, the etch process 800 forms the trench 114 with a depth dimension 184, and exposes the n-doped epitaxial silicon material of the substrate to form a trench bottom 802. In certain examples, multiple trenches are formed at 502, for example, trenches 114 and 314 in FIGS. 1 and 3 above.

Figure 9:
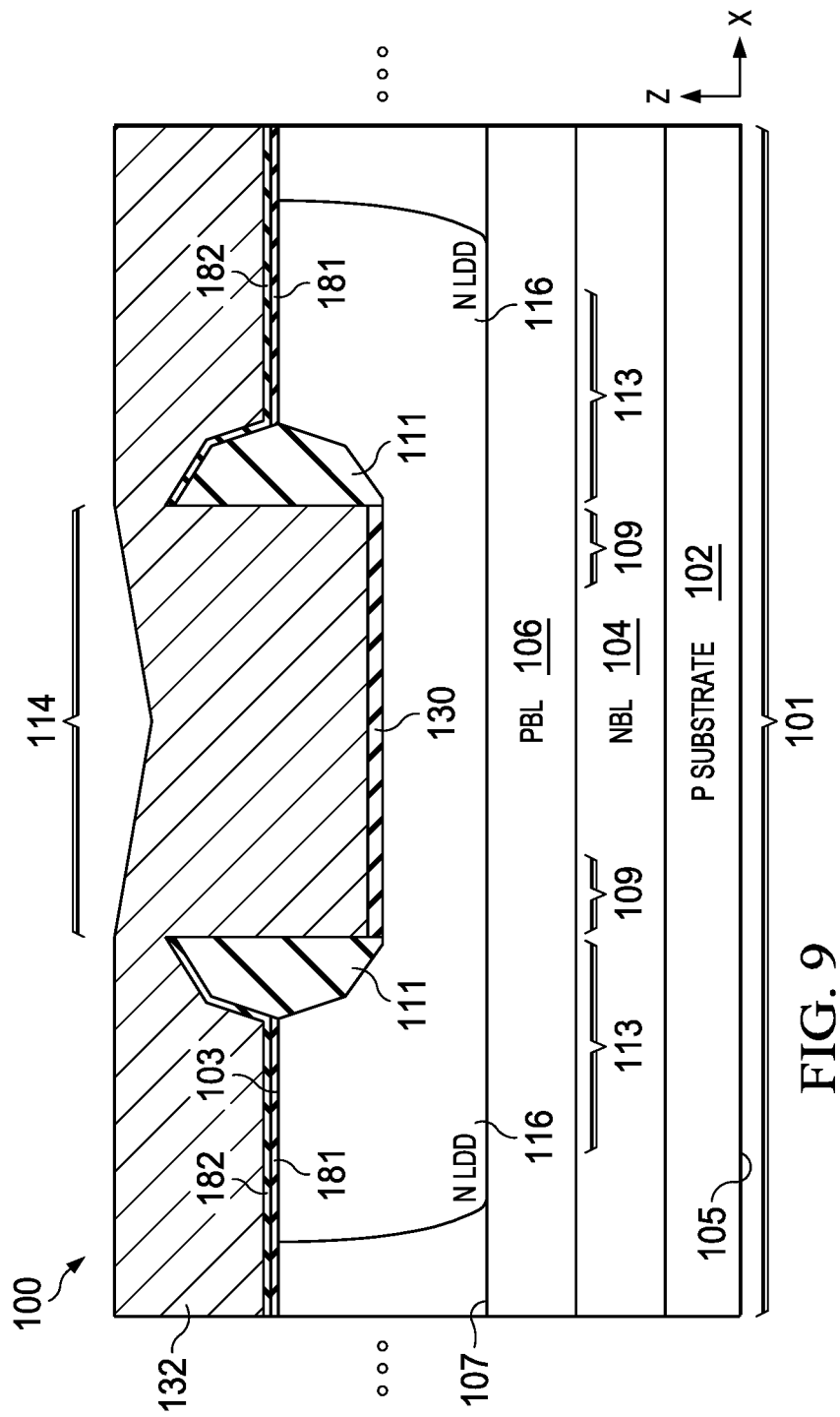
Figure 10:
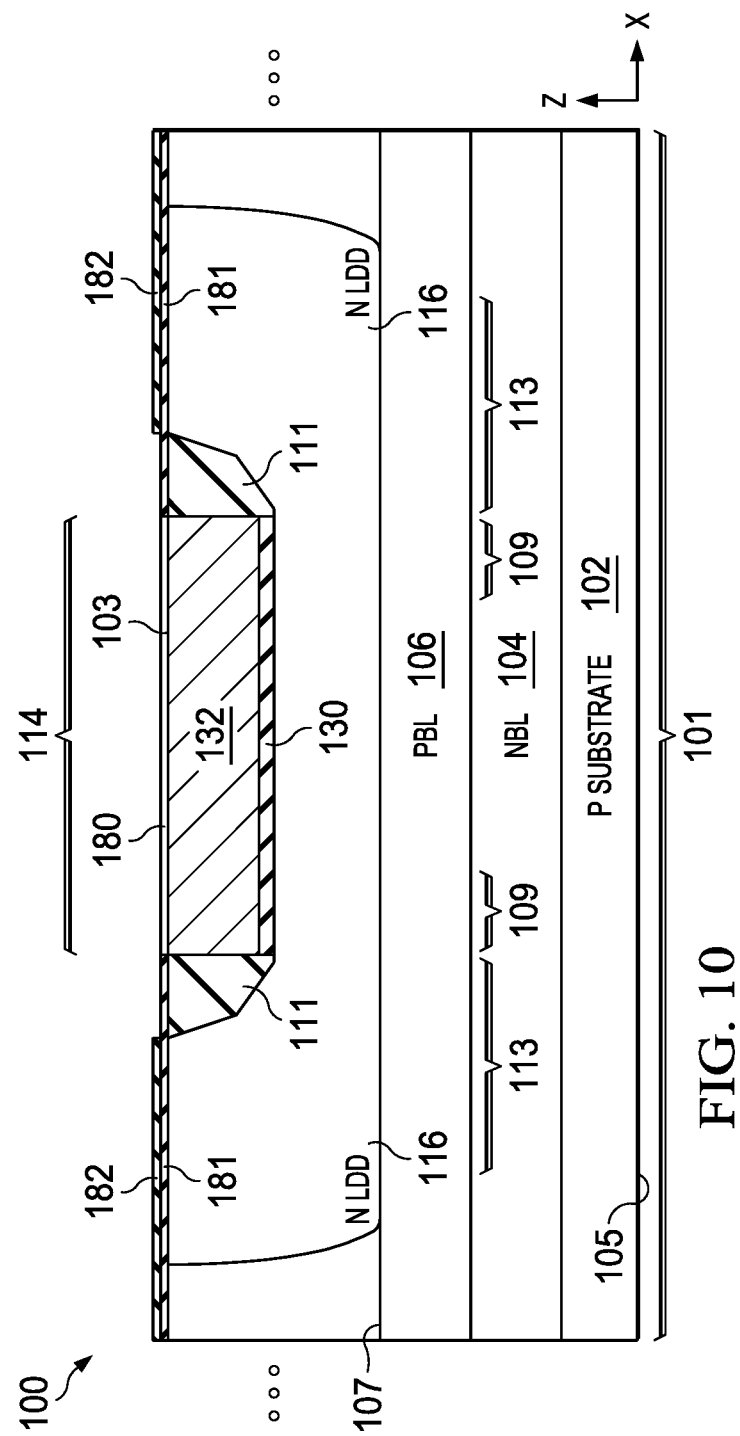
Figure 11:
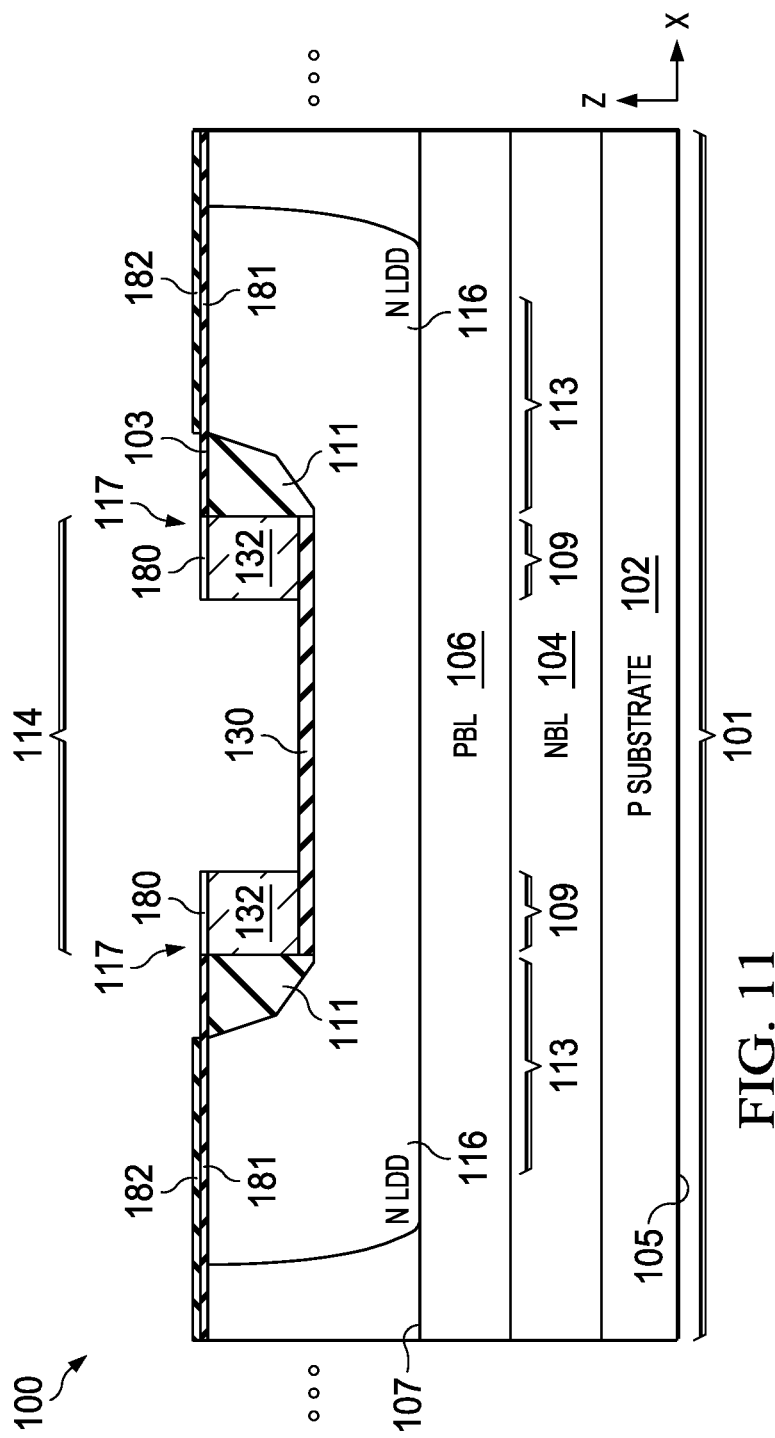

The method 500 continues at 504 in FIG. 5, with formation of the gate oxide material in the trench. FIG. 9 shows an example following formation of the gate dielectric or gate oxide material layer 130. The method 500 continues at 506 in FIG. 5 with forming and patterning a gate electrode material over the gate oxide in the trench. FIGS. 9 and 10 show an example, in which a deposition process (not shown) is performed at deposits polysilicon gate electrode material 132 the gate oxide 130 in the trench (FIG. 9). Subsequently, a chemical mechanical polishing (CMP) or dry etch the process (not shown) is performed as shown in FIG. 10, which planarizes the structure. In one example, a solicitation process (not shown) is performed, which forms the gate silicide structure 180 as shown in FIG. 10. In other implementations, gate solicitation can be done at various subsequent steps (not shown). The gate electrode material 132 in the trench is then patterned as shown in FIG. 11, for example, using an etch mask and an etch process (not shown). In the illustrated example, this produces two gate finger structures 117 laterally spaced from one another in the trench 114 around a prospective central source location generally above or otherwise proximate a prospective channel portion 109 of a subsequently formed p-type body region 108.

Figure 12:
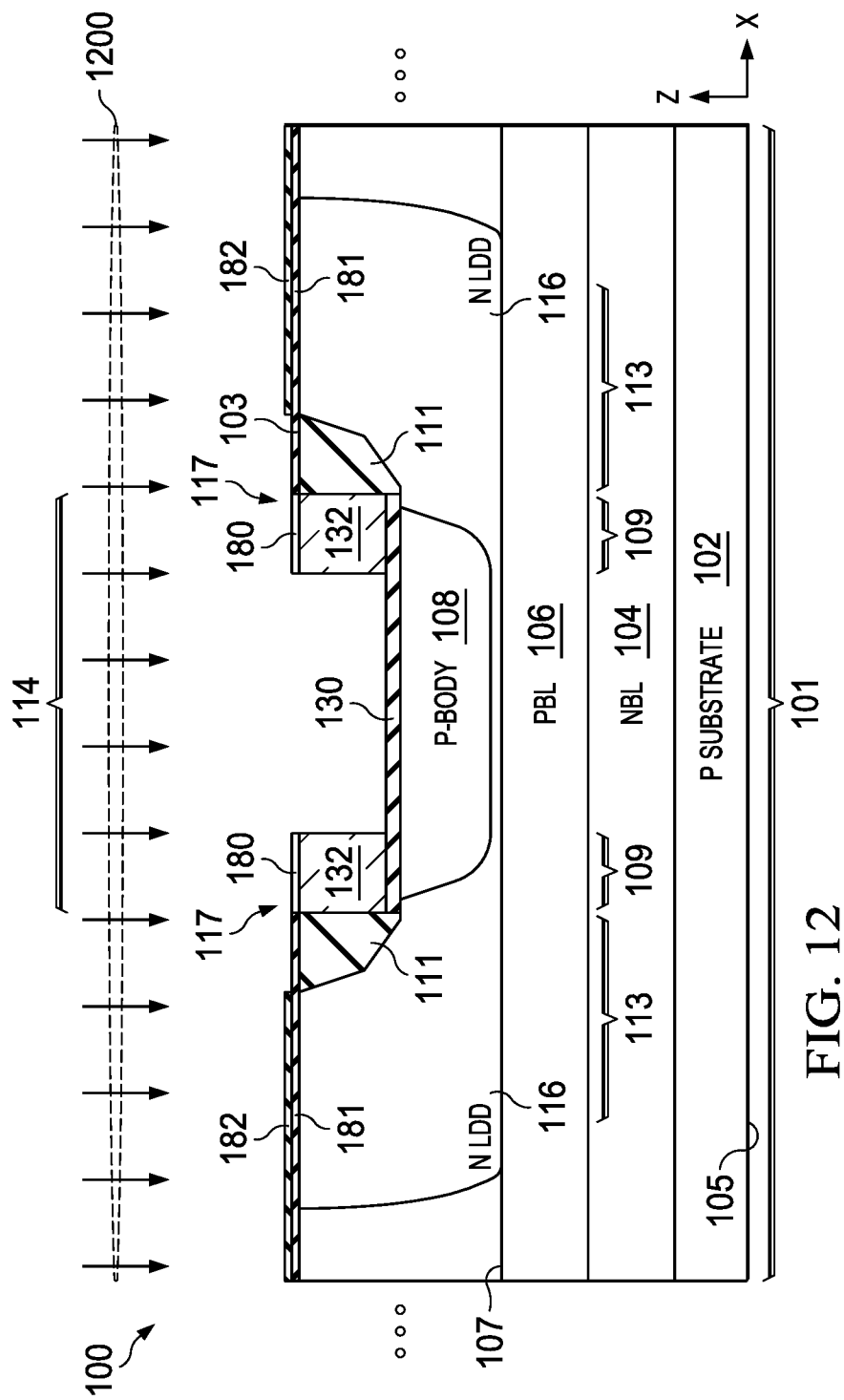
Figure 13:
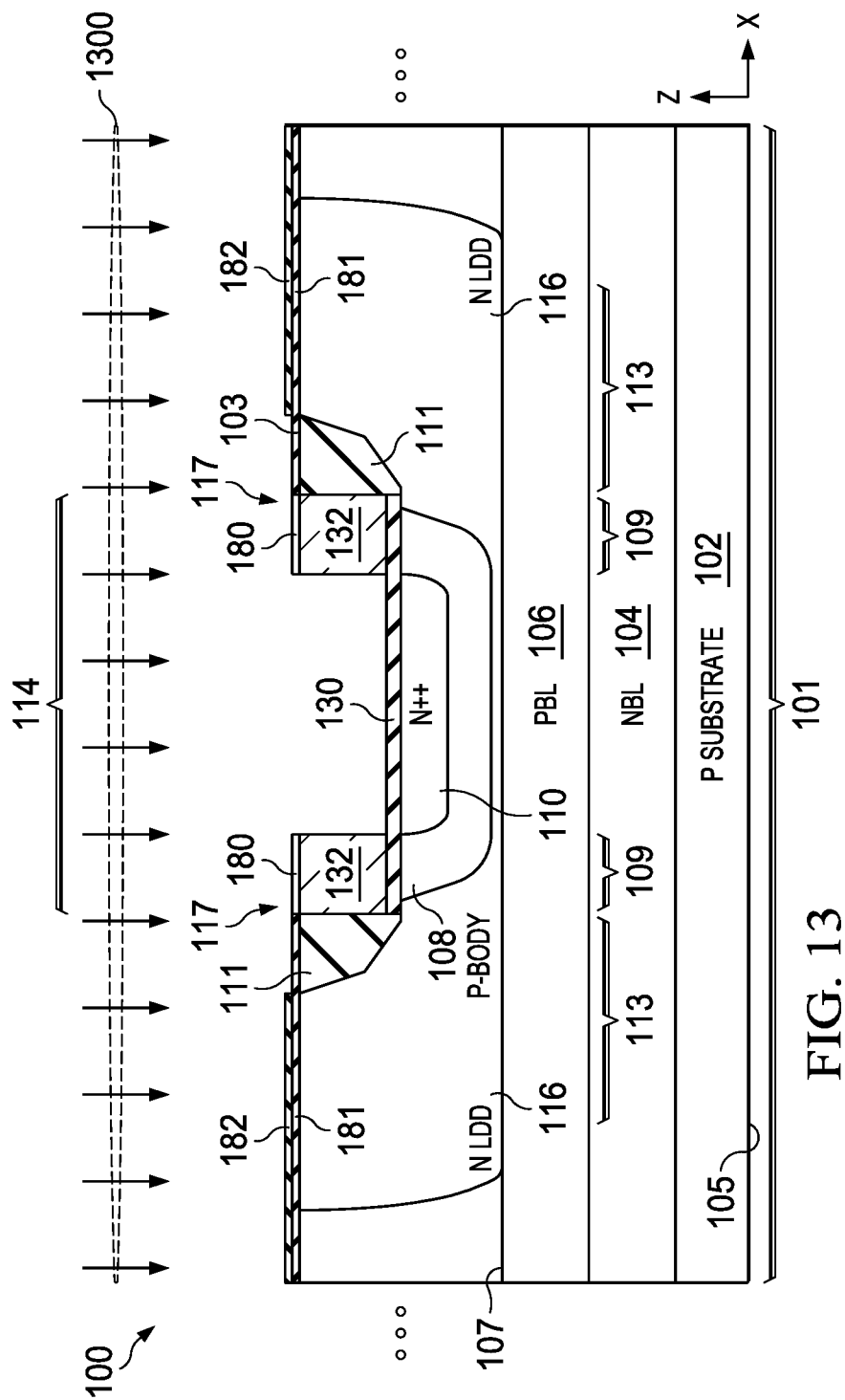

The method 500 continues at 508 in FIG. 5, with p-body and n-source implant processing. FIG. 12 shows one example in which an implantation process 1200 is performed, which implants p-dopants (e.g., boron) into the substrate to form the body region 108 beneath the bottom of the trench 114. The illustrated example also includes thermal activation processing (not shown) of the implanted boron to drive the implanted dopants laterally outward and downward into the substrate. In FIG. 13, an implantation process 1300 is performed that implants n-dopants (e.g., phosphorus) into the semiconductor substrate 102 under the trench 114 to form the source region 110 adjacent the prospective channel portion 109 of the body region 108. In one implementation, the p-body and n-source implantations at 508 our concurrently used to implant the body and source regions of a second transistor (e.g., regions 308 and 310 in FIG. 3 above), where subsequent drain implantation processing sets a gate-drain spacing of different transistors to achieve different voltage ratings with shared processing steps at 508.

Figure 14:
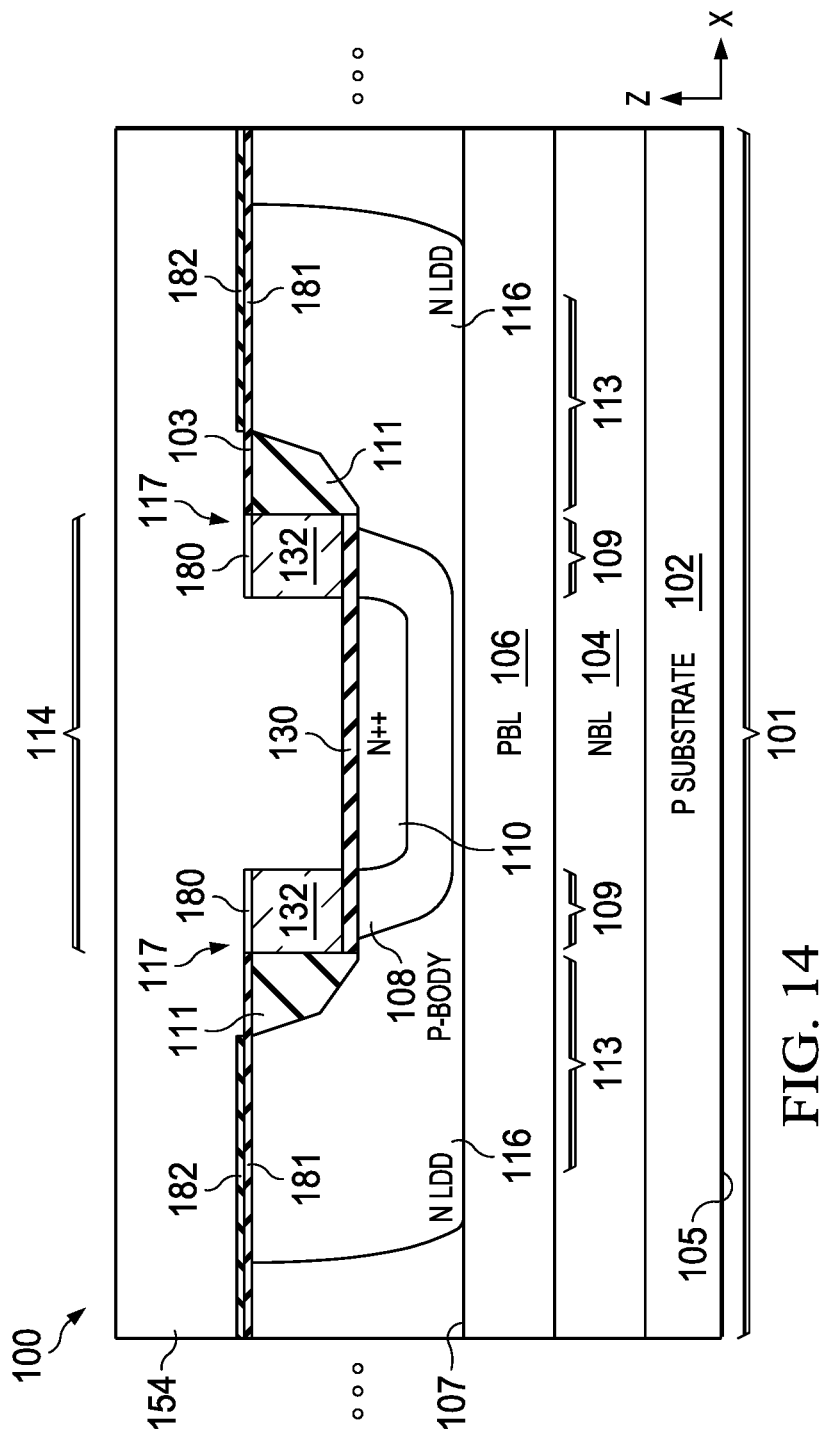
Figure 15:
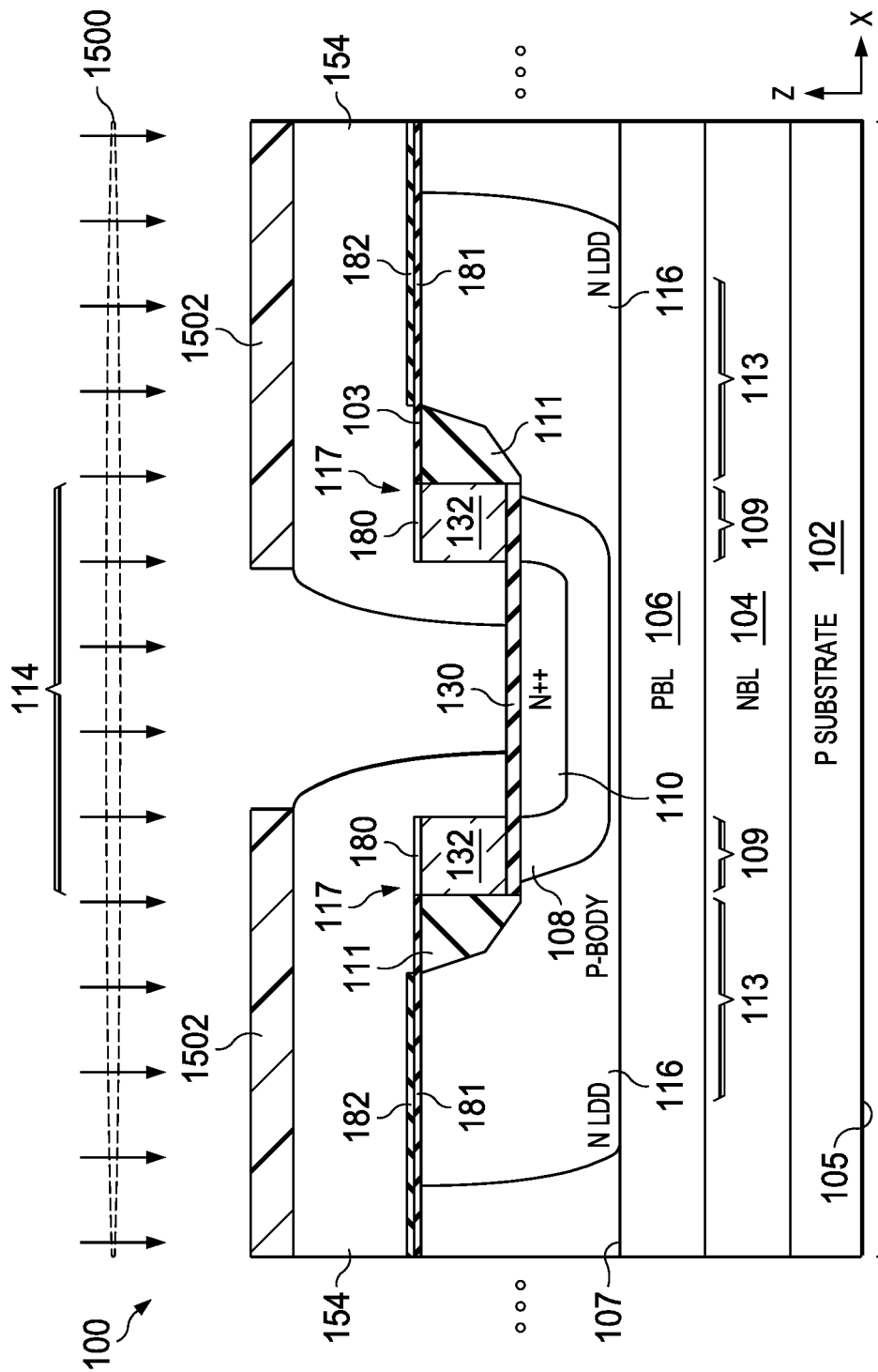
Figure 16:
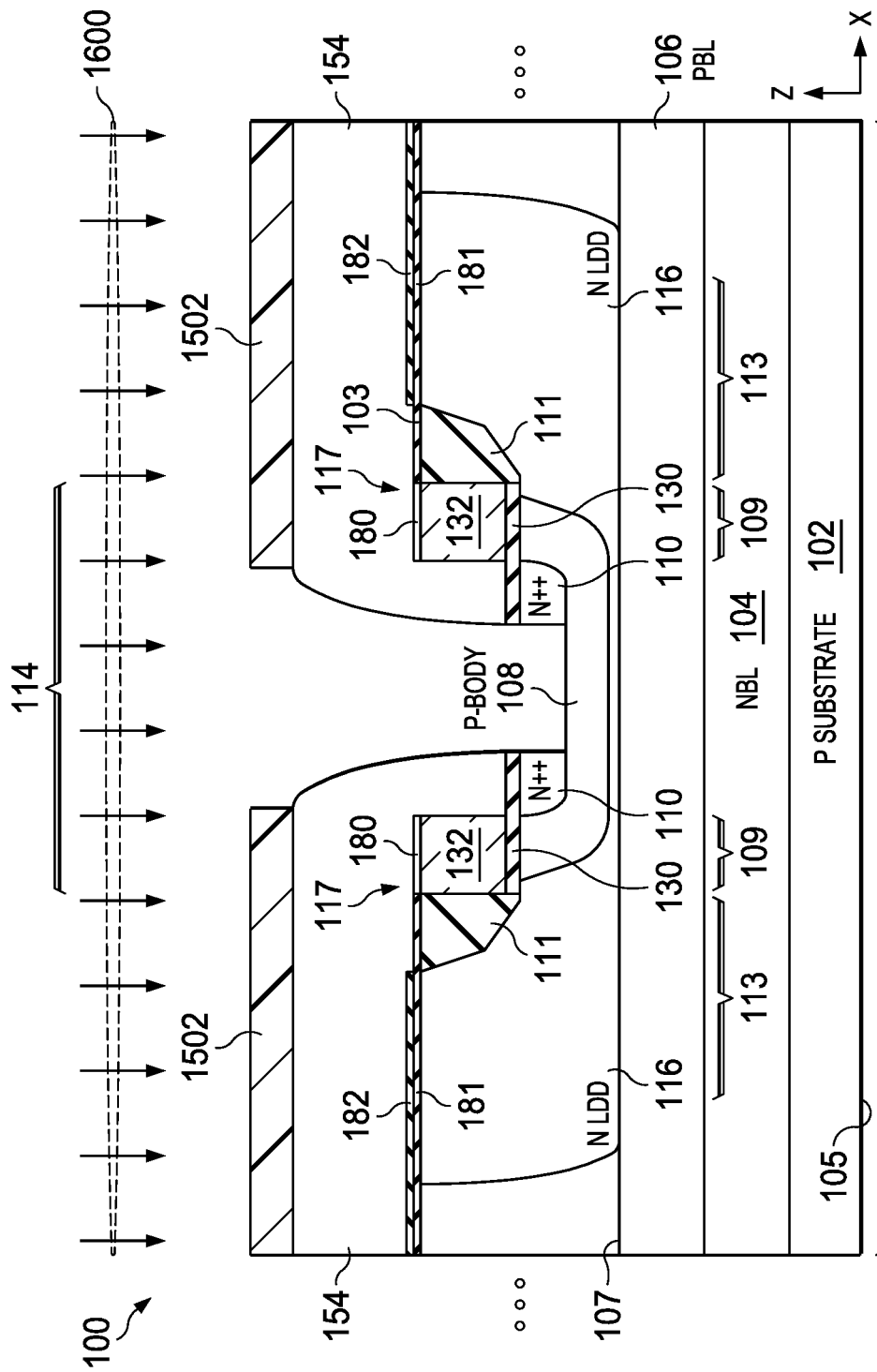
Figure 17:
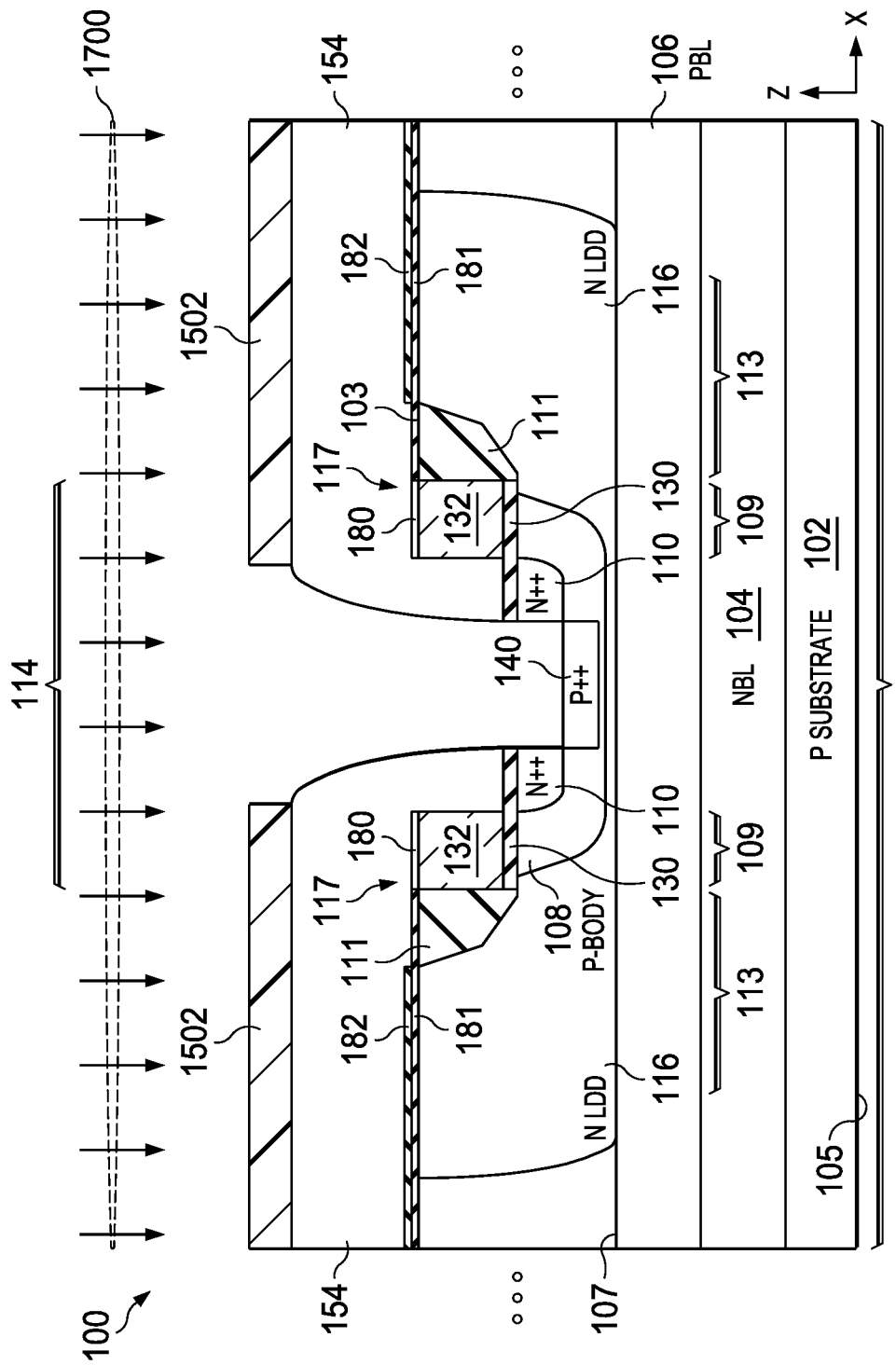

At 510 in FIG. 5, the method further includes depositing a dielectric material. FIG. 14 shows one example in which a first pre-metal dielectric (PMD) or inter-dielectric (ILD) material 154 is deposited. The deposition at 510 in one example forms silicon dioxide ($SiO_2$) or other oxide material 154 that fills the trench 114 and overlies the patterned gate structures 117. At 512, the method 500 continues with etching contact openings the source contact. FIG. 15 shows one example, in which an etch process 1500 is performed with an etch mask 1502 to open a source contact opening through the deposited dielectric material 154, which exposes the gate oxide layer material 130 in the trench 114. A further etch process 1600 is performed in FIG. 16, in one example using the etch mask 1502, to continue etching the source contact opening through the gate dielectric material layer 130 and all or a portion of the implanted source regions 110 of the substrate, to expose a portion of the p-body region 108 under the trench 114. The illustrated example also includes performing another implantation process 1700 as shown in FIG. 17 that implants p-type dopants (e.g., boron) into a portion of the body region 108 to form the P++ body contact region 140.

Figure 18:
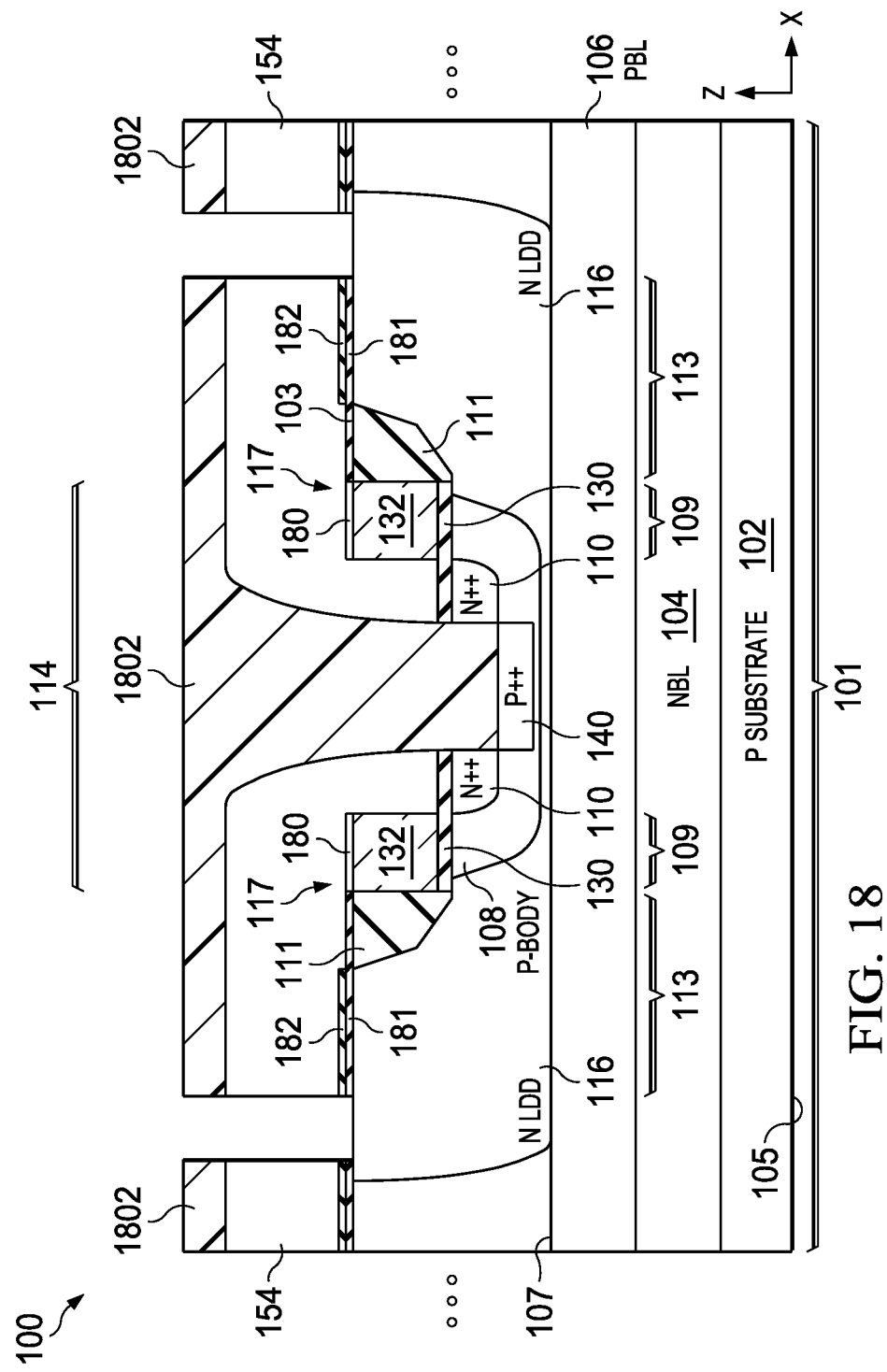
Figure 19:
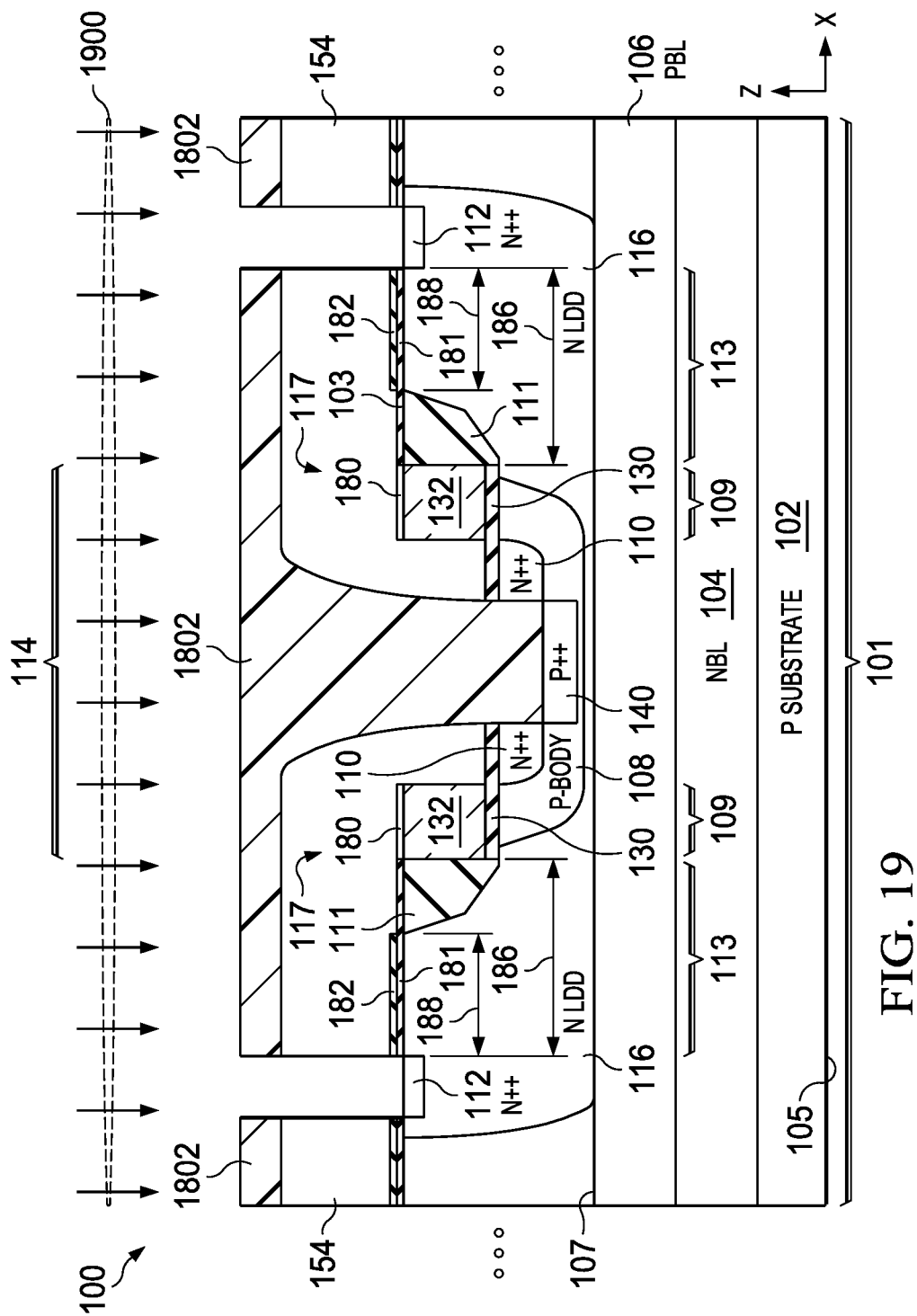

The method 500 continues with drain processing at 512-516, including etching drain contact openings at 512. FIG. 18 shows one example, in which an etch process (not shown) is performed that etches drain contact openings through the dielectric material 154. A photolithographic masking process 1800 is performed that deposits and patterns an etch mask 1802 to expose prospective drain contact regions of the deposited dielectric material 154. A drain implant is performed at 514 in FIG. 5 to implant drain regions into the top side 103 of the substrate. FIG. 19 shows an example in which another implantation process 1900 is performed that implants phosphorus or other n-type dopants into the top side 103 of the substrate to form the drain regions 112 spaced from the trench 114 by the distance 188, and spaced from the laterally outward side of the gate structure 117 by the distance 186.

Figure 20:
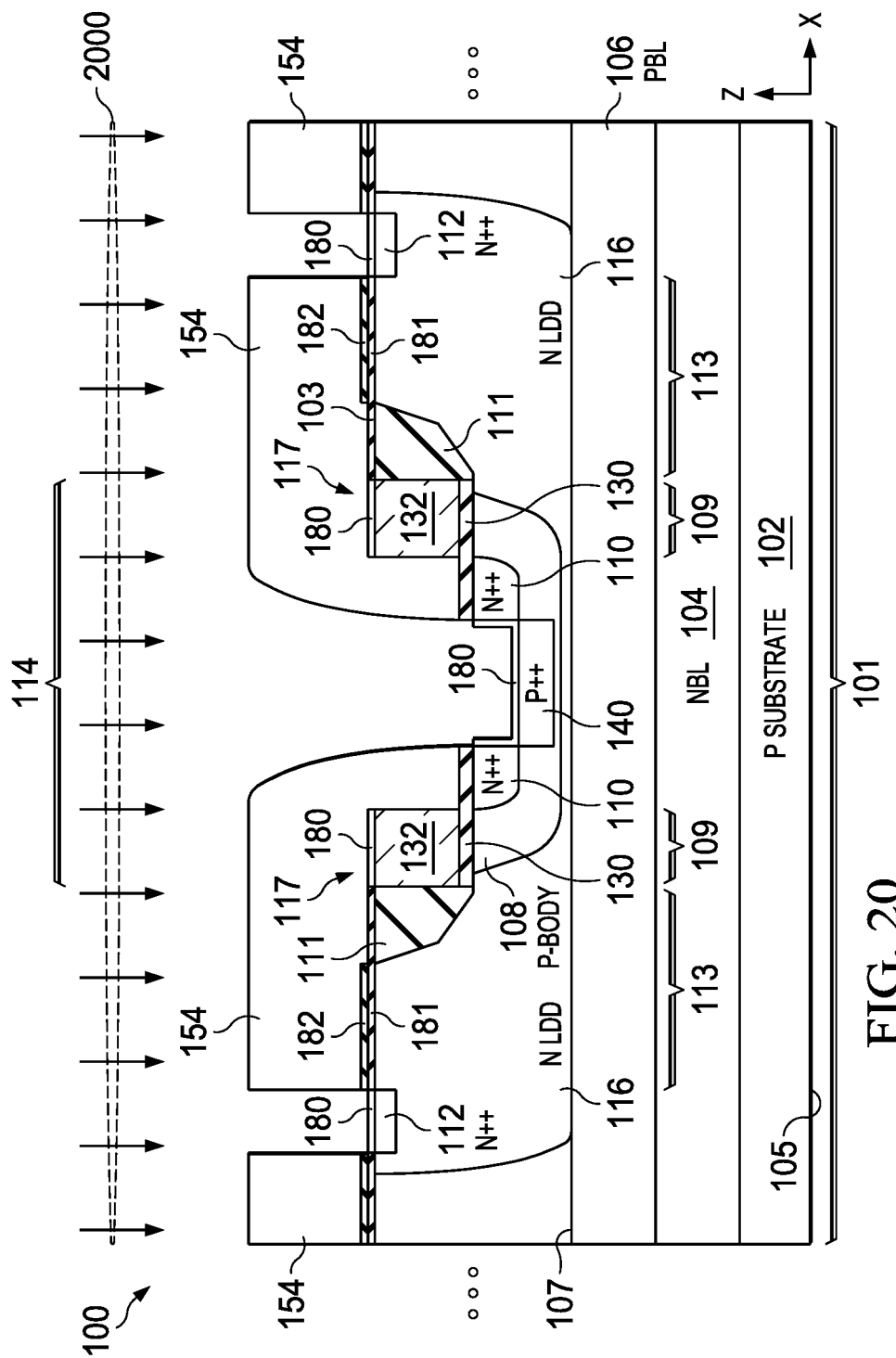
Figure 21:
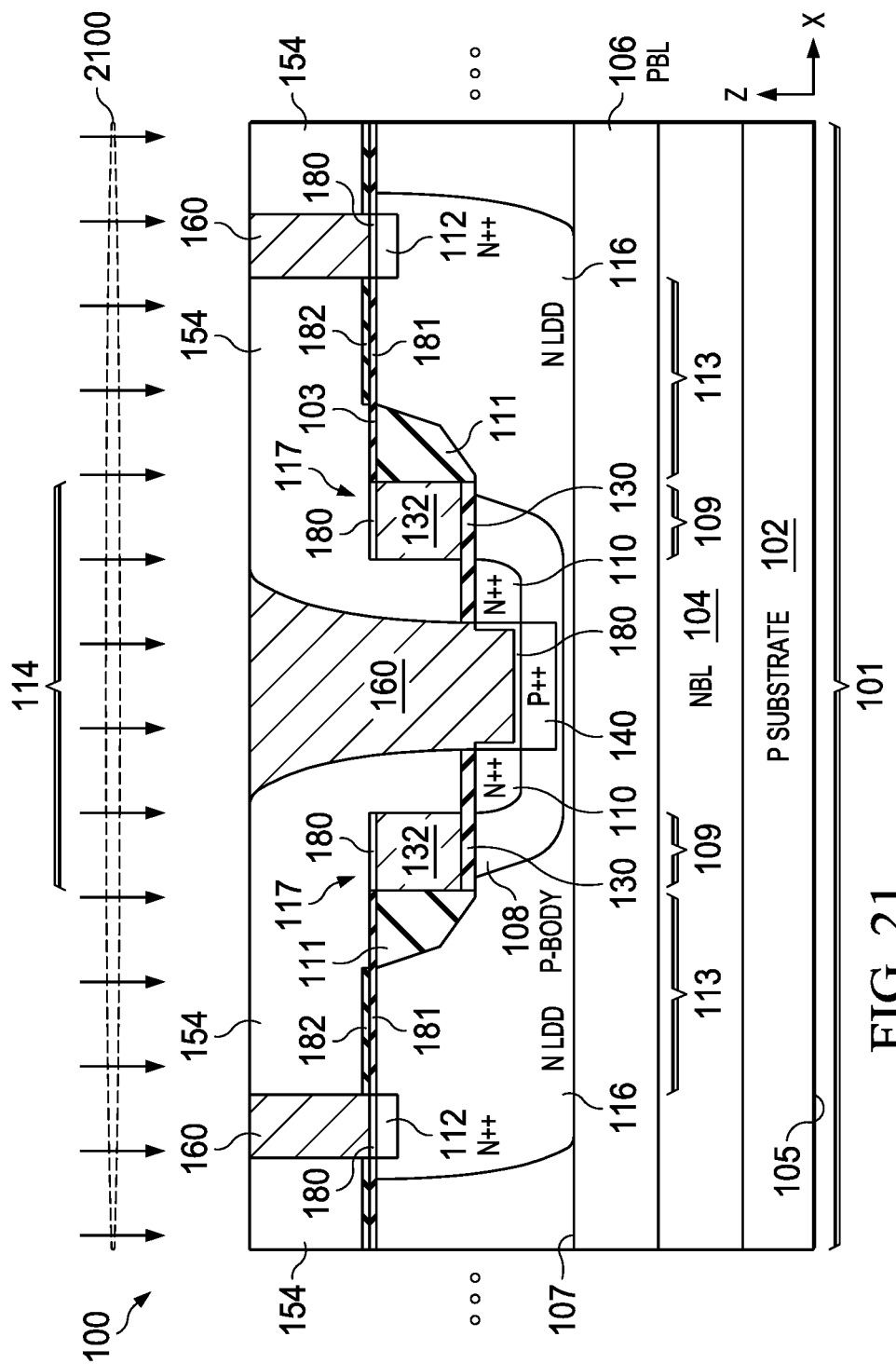

Contacts are formed at 516 in FIG. 5. FIGS. 20 and 21 show one example, in which a silicide process 2000 is performed in FIG. 20 that forms silicide structures 180 for the source contact to the source regions 110 and the body contact region 140, as well as for the drain contacts to the implanted drain regions 112. One or more interface layers (not shown) may be formed over the silicide, such as tungsten, titanium, etc. Contact formation processing 21 is performed in FIG. 21, in which tungsten or other conductive material 160 is deposited in the source and drain openings through the PMD dielectric material 154, and the wafer is planarized by chemical mechanical polishing (CMP) or other suitable plane reservation process (not shown). The process 500 continues in FIG. 5 with fabrication of upper metallization structure features at 518, followed by die simulation and packaging at 520 to provide a finished semiconductor device. In one example, the finished semiconductor device is an integrated circuit (e.g., IC 100 above) that includes two or more electronic components (e.g., transistors 101 and 301 as described above). As previously described, the process 500 can be implemented using a single set of trench formation processing steps and implantation steps to create transistors 101 and 301 having different voltage ratings, with the spacings 186, 188, 386 and 388 being adjusted for the transistors of different voltage ratings, while sharing the same processing steps to achieve economical fabrication. In another example, the finished semiconductor device is a stand-alone discrete transistor device.

Figure 22:
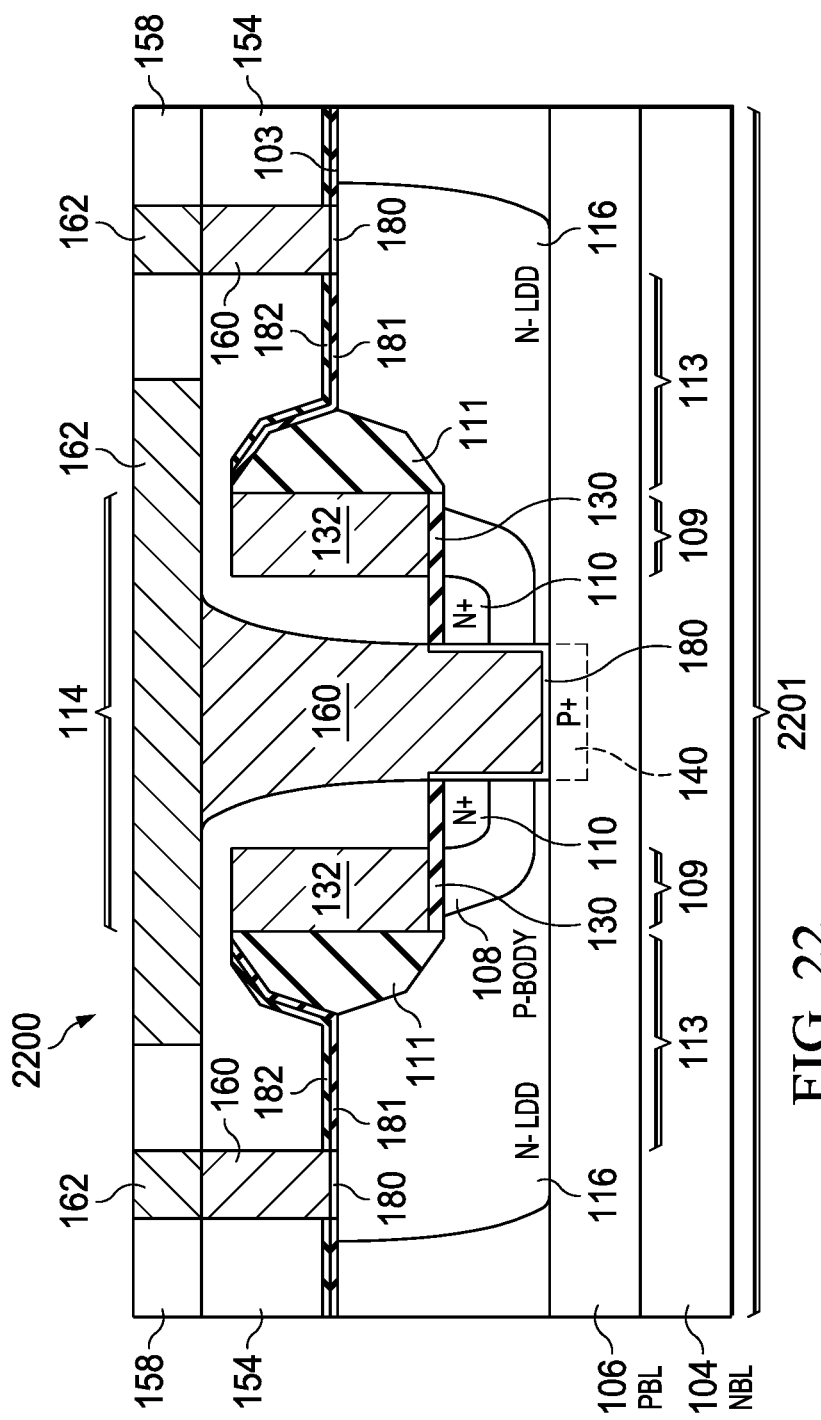
FIG. 22 is a partial sectional side elevation view of another drain extended transistor in a stand-alone, discrete transistor package with a trench gate and LOCOS oxide structures.

Referring now to FIGS. 22-28, further example semiconductor devices are described having transistors with recessed trench gates. FIG. 22 shows an example discrete transistor device 2200 with a single transistor 2201. This example is created by processing that includes forming a source contact structure 160 under the trench 114 to allow bottom side connection to the source region 110. The finished device 2200 thus provides external electrical connection for the source region 110 and the body contact 140 through the bottom of the device, as well as top side connections for the gate electrode structures 132 and the drain regions 112. The example of FIG. 22 is fabricated using an aligned process with LOCOS oxide structures 111. In one example fabrication process flow, the device 2200 is fabricated beginning with a substrate as described above, followed by thermal oxidation or oxide deposition to form the oxide layer 181, and implantation of the n-ldd region 116. A nitride hard mask 182 is deposited and etched, and LOCOS oxide 111 is formed through oxidation of unmasked portions of the substrate. In this example, the oxide is dry etched in the prospective trench region using the nitride as an etch mask, and the gate oxide is formed in the bottom of the trench. Polysilicon or other gate electrode material is then deposited in the trench, and an upper portion of the gate structure is planarized using CMP or dry etching. Gate solicitation can then be done, or this step can be performed at subsequent process points. Middle portions of the gate electrode and gate oxide structures are then etched to form laterally spaced gate finger structures, and the p-body and n-source implants are performed to form the source regions 110 and the body region 108. The processing further includes PMD dielectric deposition (material 154), and the source contact opening is masked and etched through the dielectric material 154 and then through the substrate material to form a contact opening that extends to the buried layer 106. A P+ body contact region 140 is then implanted through the source contact opening, and the dielectric oxide layer 154 is etched to form drain contact openings. The drain regions 112 are then implanted with n-type dopants (e.g., phosphorus), and the source and drain contacts are silicided to form the silicide contacts 180. Thereafter, the first metallization structure 160 is deposited and the wafer is planarized, followed by formation of one or more upper metallization layers, including the illustrated first metal dielectric layer 158 and the corresponding metal contact features 162 as shown in FIG. 22.

Figure 23:
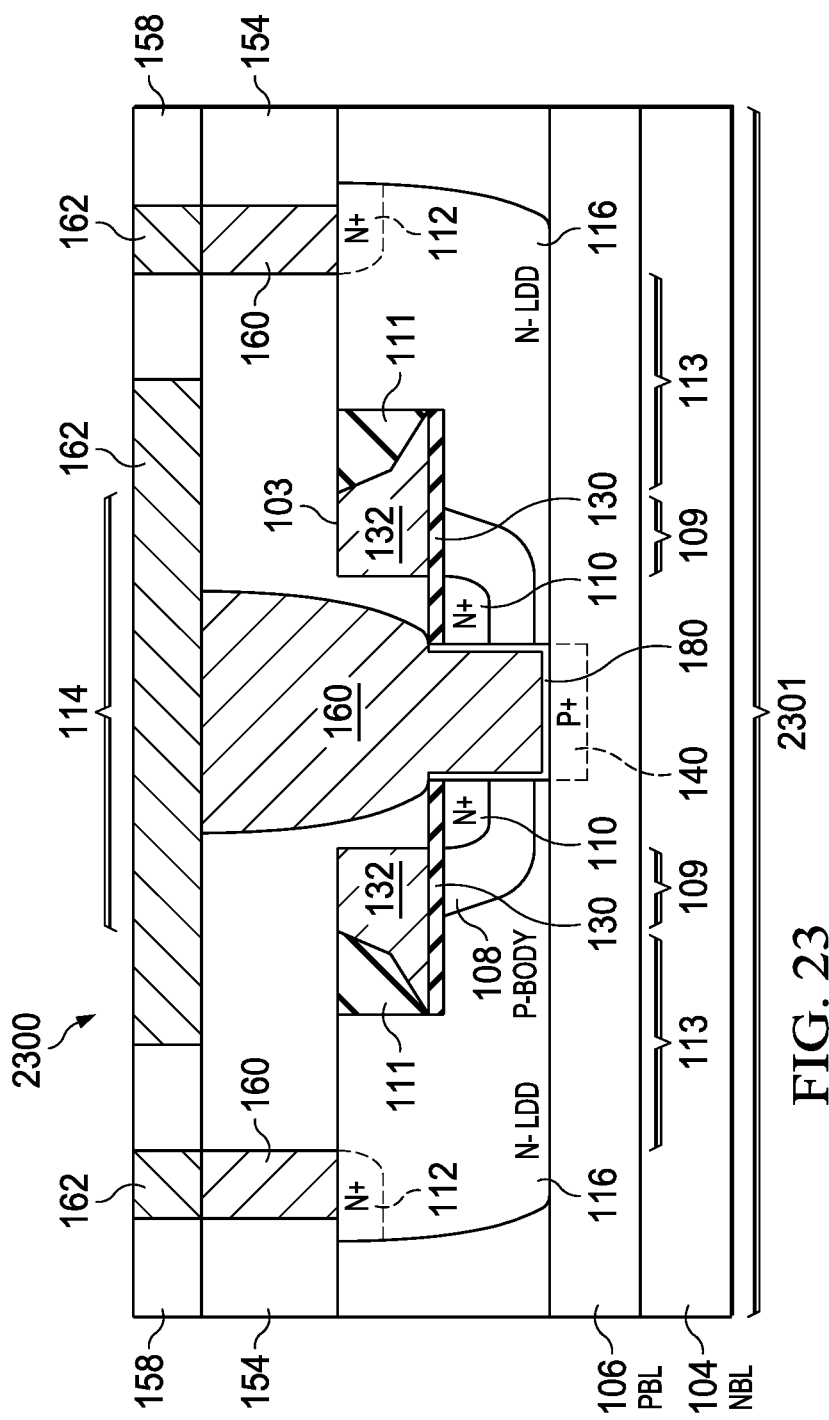
FIG. 23 is a partial sectional side elevation view of another stand-alone, discrete drain extended transistor with a trench gate made with a self-aligned process.

FIG. 23 shows another example stand-alone, discrete drain extended transistor semiconductor device 2300 with a trench gate drain extended transistor 2301 made with an aligned process. In one example, the device 2300 is fabricated by implanting the n-ldd region 116 into the top of a semiconductor substrate. In this example, an oxide or nitride hard mask is then used with an etch process to form the trench 114. The gate oxide structure 130 is then formed in the bottom of the trench, and the gate electrode material 132 (e.g., polysilicon) is deposited in the trench. The wafer is then planarized, and the top surface of the gate electrode material is silicided. In other examples, the gate silicide can be formed during later processing steps. An oxide formation process is then performed, such as a thermal gate re-oxidation, which forms the PMD oxide layer 154, and a patterned etch process is performed to etched through the oxide layer 154 and the gate structure layers 130 and 132 to expose a portion of the substrate at the bottom of the trench in the prospective source region. An implantation process is then performed to implant p-type dopants (e.g., boron) to form the body region 108, and another implantation is performed to implant n-type dopants (e.g., phosphorus) to form the source region 110. The processing in this example further includes another ILD dielectric deposition and etch to form oxide along the inner sidewalls of the patterned gate structures 130, 132, and a patterned etch process is performed to extend the source contact opening through the implanted source regions 110 and the body region 108, to expose an upper portion of the buried layer 106. An implantation process is then performed to implant n-type dopants (e.g., phosphorus) into the exposed portion of the buried layer 106 to form the body contact region 140, followed by silicide processing to form silicide for the drain and source contacts. Tungsten or other aluminum is then deposited and etched to form separate source, drain and gate contacts, followed by die simulation and packaging to provide the discrete drain extended transistor device 2300 of FIG. 23.

Figure 24:
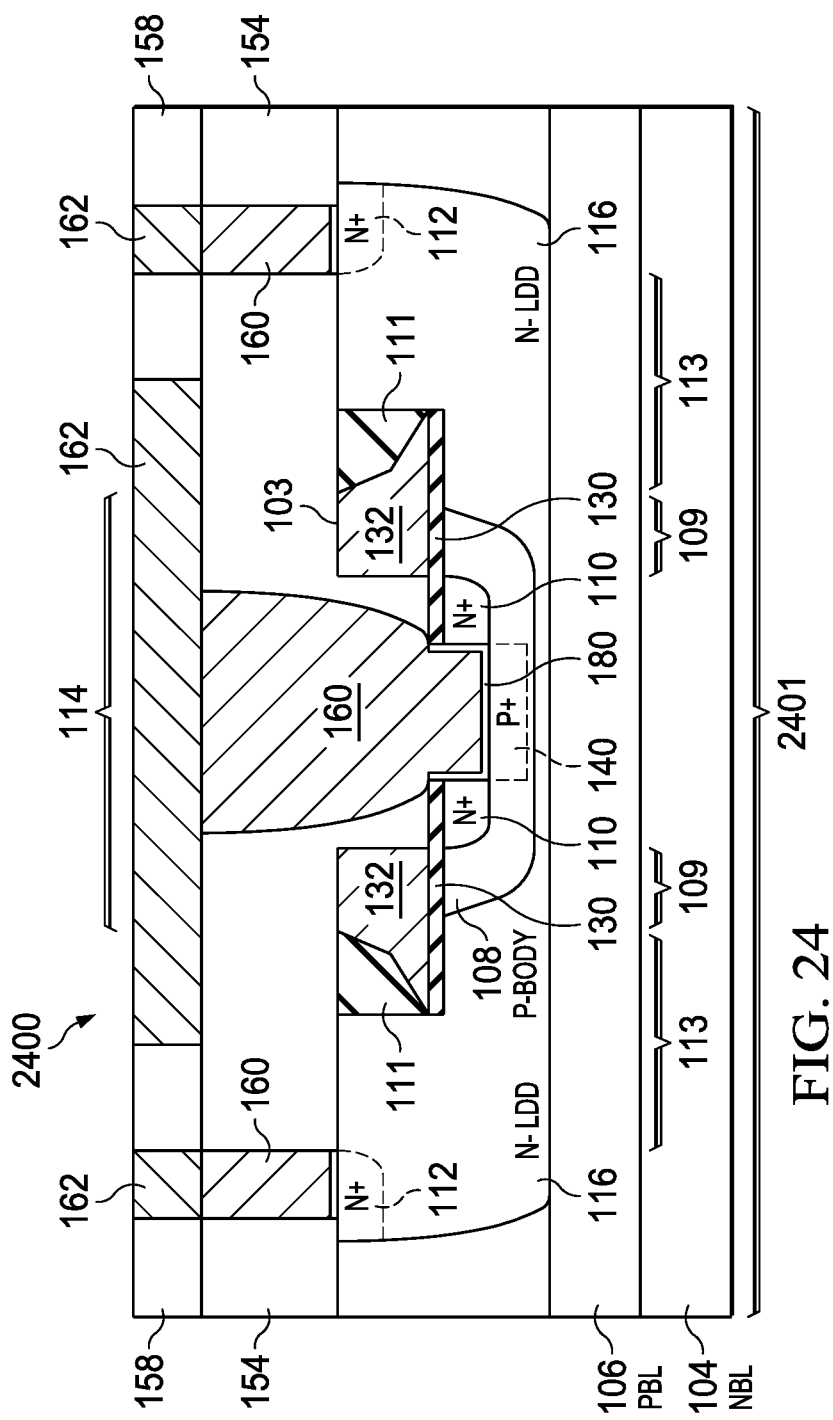
FIG. 24 is a partial sectional side elevation view of an integrated circuit with another drain extended transistor made with a self-aligned process.

FIG. 24 shows another example integrated circuit device 2400 with another drain extended transistor 2401 including a recessed gate made with an aligned process. The device 2400 in one example is fabricated using a process flow and sequence similar to that used to fabricate the stand-alone discrete device of FIG. 23, except that the recessed source contact etch extends only to the body region 108, and the body contact region 140 is implanted into the body region 108 to provide an upper source contact as shown in FIG. 24.

Figure 25:
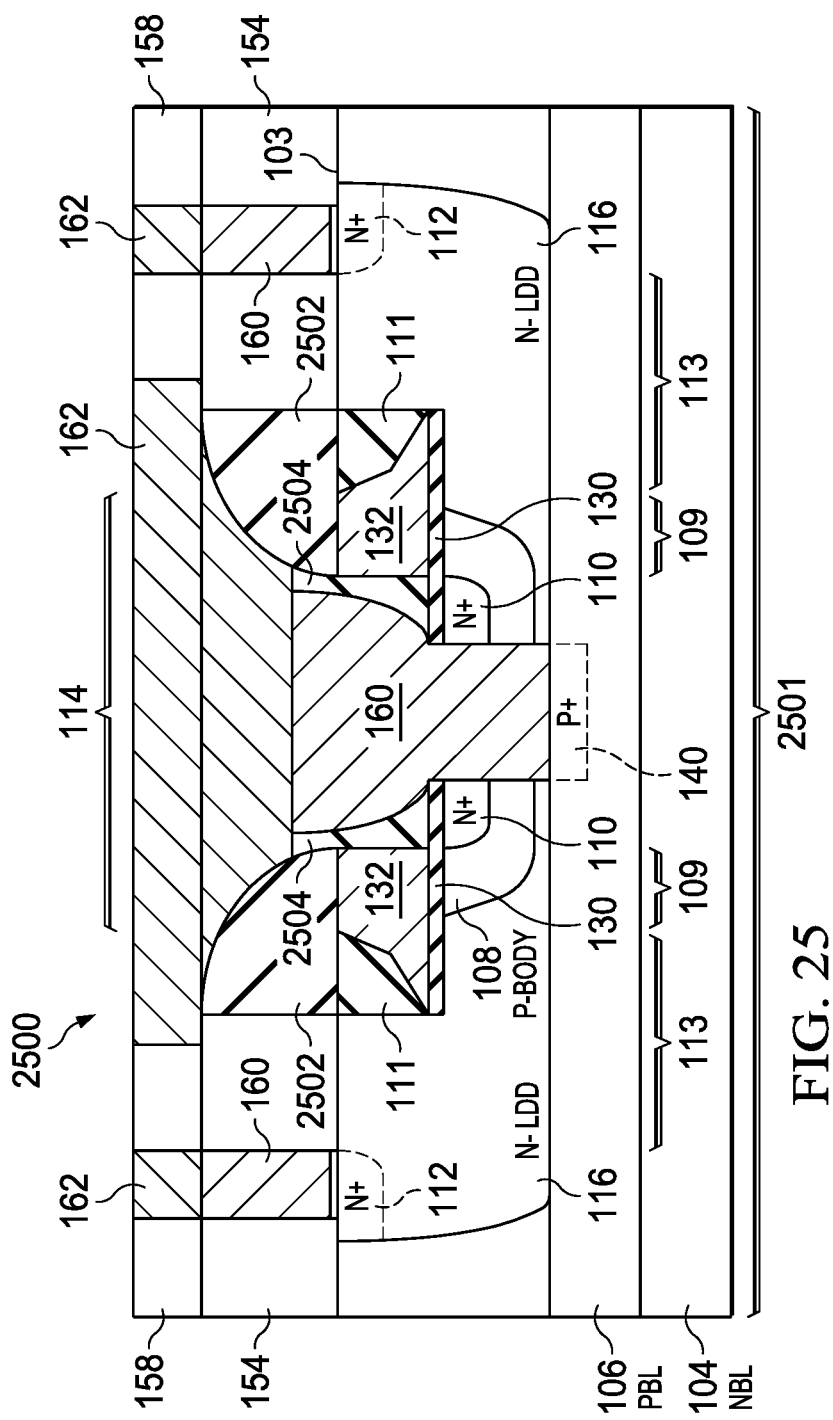
FIG. 25 is a partial sectional side elevation view of another stand-alone, discrete drain extended transistor with a trench gate made with a self-aligned process.

FIG. 25 shows another example stand-alone discrete device 2500 with a drain extended transistor 2501 that includes a recessed gate. The device 2500 is fabricated in one example by implanting the n-ldd region 116 into the top of a semiconductor substrate, forming and patterning an oxide or nitride hard mask, and performing an etch process to form the trench 114. The gate oxide structure 130 is then formed in the bottom of the trench, and the gate electrode material 132 (e.g., polysilicon) is deposited in the trench. A dry etch process is then used to remove deposited polysilicon using the nitride hard mask, to leave and exposed upper surface of the polysilicon approximately level with the top side 103 of the substrate. The top surface of the gate electrode material can be silicided at this point, or the gate silicide can be formed during later processing steps. An oxide formation process is then performed, such as a thermal gate re-oxidation, which forms the PMD oxide layer 154. A nitride material is then deposited in the trench, and a central opening is etched through the deposited nitride to expose the re-oxidized material above the trench, leaving nitride spacers 2502 along the lateral sides above the trench 114. A dry polysilicon etch process is then performed using the nitride spacers 2502 to form a self-aligned opening through the gate material layers 132 and 130. Further processing includes implantation of the p-type body region 108 and the n-type source region 110, followed by deposition of further ILD oxide material 2504 and spacer etching through the deposited material 2504 in order to form a narrower opening above the implanted source region 110 at the bottom of the trench 114. The processing further includes a recessed contact etch through the exposed portions of the source region 110, the body region 108, and extending to expose an upper portion of the buried layer 106. An implantation process is then performed to implant p-type dopants into the layer 106 to form the body contact region 140. A contact etch process is performed to etch through the PMD oxide material 158 above the prospective drain regions, followed by an implantation step to form the drain regions 112. Thereafter, a silicide process is performed that forms the silicide for the drain and source contacts. Tungsten or other aluminum is then deposited and etched to form separate source, drain and gate contacts, followed by die simulation and packaging to provide the discrete drain extended transistor device 2500 in FIG. 25.

Figure 26:
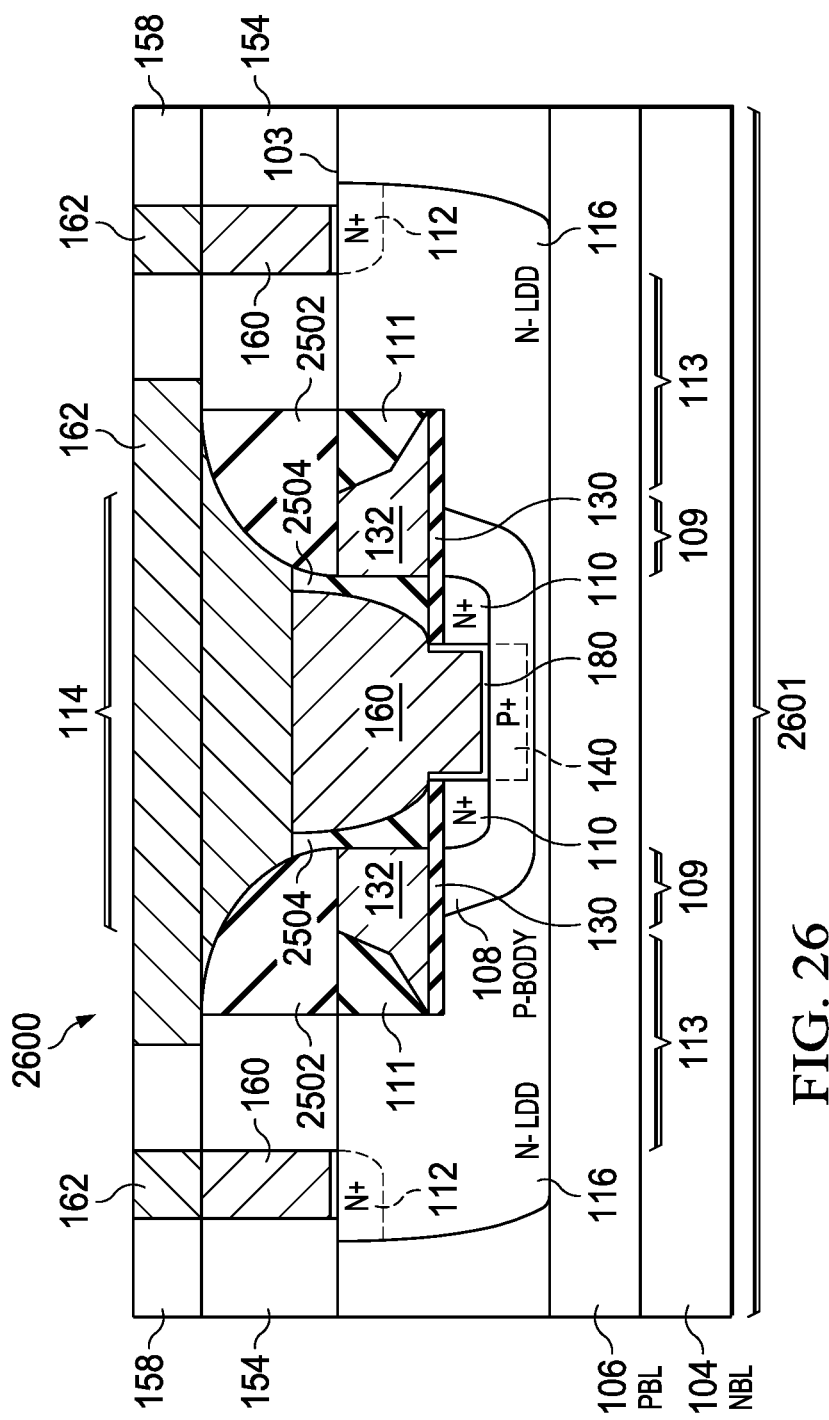
FIG. 26 is a partial sectional side elevation view of another integrated circuit with a drain extended transistor made with a self-aligned process.

FIG. 26 illustrates another example integrated circuit device 2600 that includes another drain extended transistor 2601 with a recessed gate. The device 2600 in one example is fabricated using a process flow and sequence similar to the self-aligned process used to fabricate the stand-alone discrete device of FIG. 25, except that the recessed source contact etch extends only to the body region 108, and the body contact region 140 is implanted into the body region 108 to provide an upper source contact as shown in FIG. 26.

Figure 27:
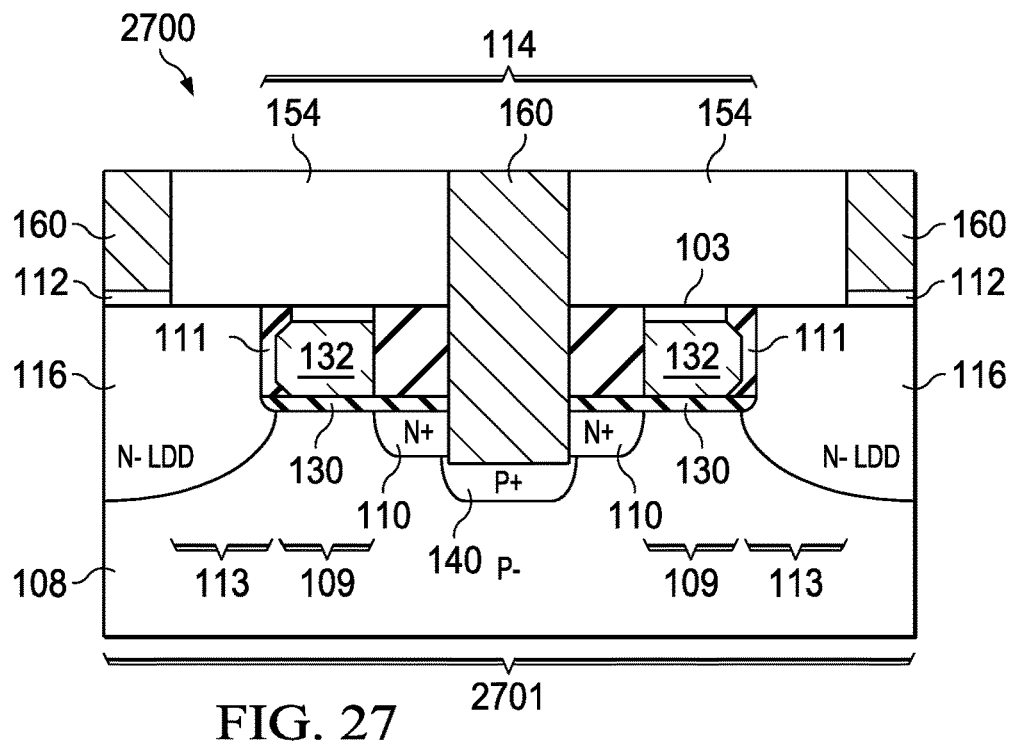
FIG. 27 is a partial sectional side elevation view of another drain extended transistor with a trench gate in an integrated circuit device.
Figure 28:
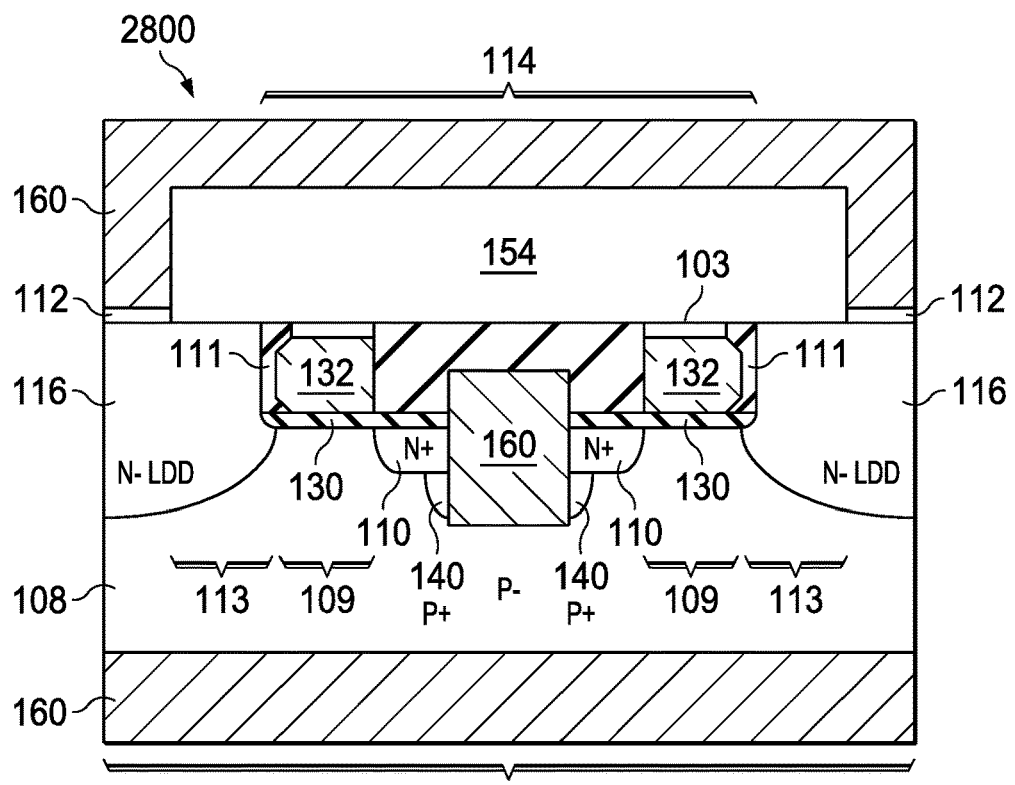
FIG. 28 is a partial sectional side elevation view of another stand-alone, discrete drain extended transistor with a trench gate.

FIG. 27 shows another example integrated circuit device 2700 with a drain extended transistor 2701 that includes a trench gate. In this example, the device 2700 is similar in most respects to the integrated device 100 illustrated and described above in connection with FIGS. 1-4. However, the implanted n-ldd regions 116 in the example of FIG. 27 do not extend laterally under the source regions 110. FIG. 28 illustrates another example stand-alone, discrete device 2800 with a recessed gate drain extended transistor 2801. The device 2800 is similar in most respects to the integrated device 2700 of FIG. 27, except that the source contact 160 extends downward into the p-body region 108, and a bottom source contact 160 is provided, along with a top side drain contact 160.

Disclosed examples provide integrated and discrete LDMOS improvements to facilitate further improved efficiency and increased switching frequency along with reduced size and increased power density. The disclosed examples further provide economical fabrication processing techniques to produce integrated devices with multiple drain extended transistors of different voltage ratings using a streamlined process flow with shared processing steps and critical dimension adjustments for different voltage rated transistors. The disclosed structures and techniques facilitate low voltage micro-on specific resistance (RSP) devices and fabrication thereof for improved figure of merit (FOM) for MOSFETs, such as MOSFETs rated up to approximately 40 V, together with reduced specific resistance the compared with conventional processes. The disclosed examples can be built using modified linear-bipolar fabrication processes, and provide easy adaptability to produce integrated devices with drain extended transistors of different voltage ratings in combination with low-power digital circuitry. The disclosed recessed trench gate structures can be implemented to provide smaller transistor device channel regions shielded by the vertical trench, while avoiding channel hot carrier affects associated with conventional LDMOS p-body corners, along with streamlined voltage scaling using the LDD drift region critical dimension, such as the drain-gate spacing 186 and/or the drain-trench spacing 188. Further benefits of certain examples include streamlined process sequences for self-aligned spacers to define polysilicon gate width for improved critical dimension control with no misalignment, along with some a vertical drift region structures to facilitate the use of small pitch feature sizes and specific resistance reduction. Discrete device solutions are also disclosed that provide low resistance to improve switching power supply and other system performance by reducing lossy components including metal and substrate connections The disclosed fabrication processes in certain examples facilitate low mask count fabrication to control production costs for integrated and discrete device manufacturing. Described examples provide particular benefits in use with power switching circuits for both discrete and integrated devices with recessed trench gate structures to improve efficiency while maintaining current switch reliability and high power density to allow improvement in on-state and switching losses along with higher frequency switching operation and reduction in overall system size, improvement in efficiency and cost. The disclosed examples them in straight elimination of conventional p-body corners, now shielded by thick oxide and gate structures for high reliability and low HCI, with thick oxide proximate the gate structure near the transistor drift region. The described structures also provide benefits in terms of robust avalanche performance, with the ability to pin the avalanche point away from the gate corner using vertical clamping, and the ability to design various voltages by simple critical dimension changes (e.g., spacing dimensions 186 and 188 above), while using the same or similar trench depth and drift region doping for various voltage transistor devices to facilitate economical fabrication. In addition, further pitch savings can be realized, including narrower source-drain spacing since the drift region is at least partially vertical. The disclosed devices, moreover, facilitate the ability to mitigate or eliminate substrate resistance for discrete products by use of deep silicide plugs for the source connections. The disclosed transistor structures, moreover, do not require deep trench formation, for example, trenches of only about 0.25-0.30 µm are deep enough to accommodate the recessed gate structures for relatively high voltage rated power switching transistors.

Modifications are possible in the described embodiments, and other embodiments are possible, within the scope of the claims.

The following is claimed:
1. A semiconductor device, comprising:
   a semiconductor substrate with a trench that extends inward from a side of the semiconductor substrate;
   a body region under the trench in the semiconductor substrate, the body region including majority carrier dopants of a first type; and
   a drain extended transistor, including:
     a source region under the trench in the semiconductor substrate adjacent a channel portion of the body region, the source region including majority carrier dopants of a second type,
     a drain region spaced from the trench in the semiconductor substrate, the drain region including majority carrier dopants of the second type,
     a drift region between the channel portion of the body region and the drain region, the drift region including majority carrier dopants of the second type,
     a gate structure, including: a gate dielectric layer in the trench proximate the channel portion of the body region, and a gate electrode on the gate dielectric layer in the trench, and an oxide structure in the trench between a side of the gate structure and the drift region,
wherein the drain region is spaced from the gate structure by a first distance;
wherein the semiconductor substrate includes:
a second trench that extends inward from the side of the semiconductor substrate, and
a second body region under the second trench in the semiconductor substrate, the second body region including majority carrier dopants of the first type;
wherein the semiconductor device further comprises a second drain extended transistor, including:
a second source region under the second trench in the semiconductor substrate adjacent a second channel portion of the second body region, the second source region including majority carrier dopants of the second type,
a second drain region spaced from the second trench in the semiconductor substrate, the second drain region including majority carrier dopants of the second type,
a second drift region between the second channel portion of the second body region and the second drain region, the second drift region including majority carrier dopants of the second type,
a second gate structure, including: a second gate dielectric layer in the second trench proximate the second channel portion of the second body region, and a second gate electrode on the second gate dielectric layer in the second trench, and
a second oxide structure in the second trench between a side of the second gate structure and the second drift region;
wherein the second drain region is spaced from the second gate structure by a second distance; and
wherein the first distance is different than the second distance.

2. The semiconductor device of claim 1, wherein the trench has a first trench depth, wherein the second trench has a second trench depth, and wherein the first and second trench depths are the same.

3. The semiconductor device of claim 2, wherein the drift region and the second drift region have the same doping profile of the majority carrier dopants of the second type.

4. The semiconductor device of claim 1, wherein the drift region and the second drift region have the same doping profile of the majority carrier dopants of the second type.

5. The semiconductor device of claim 1, wherein the oxide structure and the second oxide structure are local oxidation of silicon (LOCOS) structures.

6. A semiconductor device, comprising:
a semiconductor substrate with a trench that extends inward from a side of the semiconductor substrate, the trench having side surfaces and a bottom surface;
a body region under the trench in the semiconductor substrate, the body region including majority carrier dopants of a first type; and
a drain extended transistor, including:
a source region under the bottom surface of the trench in the semiconductor substrate adjacent a channel portion of the body region, the source region including majority carrier dopants of a second type, the channel portion under the bottom surface of the trench,
a drain region spaced from the trench in the semiconductor substrate, the drain region including majority carrier dopants of the second type,
a drift region between the channel portion of the body region and the drain region, the drift region including majority carrier dopants of the second type,
a gate structure, including: a gate dielectric layer in the trench proximate the channel portion of the body region, and a gate electrode on the gate dielectric layer in the trench, and
an oxide structure in the trench between a side of the gate structure and the drift region.

7. The semiconductor device of claim 6, wherein the oxide structure is a local oxidation of silicon (LOCOS) structure.

8. The semiconductor device of claim 6, wherein the semiconductor device is a discrete transistor device with a single transistor.

9. The semiconductor device of claim 6, wherein the semiconductor device is an integrated circuit with a plurality of transistors.

10. The semiconductor device of claim 6, wherein the channel portion is a lateral channel.

11. The semiconductor device of claim 6, further comprising a source contact structure extending through the trench and contacting the source region below the trench.

12. A drain extended transistor, comprising:
a source region under a trench of a semiconductor substrate, the source region laterally adjacent a channel portion of a body region, the body region including majority carrier dopants of a first type, the source region including majority carrier dopants of a second type;
a drain region spaced from the trench in the semiconductor substrate, the drain region including majority carrier dopants of the second type;
a drift region between the channel portion of the body region and the drain region, the drift region including majority carrier dopants of the second type;
a gate structure, including: a gate dielectric layer in the trench proximate the channel portion of the body region, and a gate electrode on the gate dielectric layer in the trench; and
an oxide structure in the trench between a side of the gate structure and the drift region.

13. The drain extended transistor of claim 12, wherein the oxide structure is a local oxidation of silicon (LOCOS) structure.

14. The semiconductor device of claim 12, wherein the channel portion is a lateral channel.

15. The semiconductor device of claim 12, further comprising a source contact structure extending through the trench and contacting the source region below the trench.

16. A semiconductor device, comprising:
a semiconductor substrate with a trench, the trench having side surfaces and a bottom surface;
a body region under the trench in the semiconductor substrate;
a drain extended transistor, including:
a source region laterally adjacent a channel portion of the body region at a location under the bottom surface of the trench,
a drain region spaced from the trench in the semiconductor substrate,
a drift region between the channel portion of the body region and the drain region,
a gate structure, including: a gate dielectric layer and a gate electrode in the trench over the channel portion of the body region, and an oxide structure in the trench between a side of the gate structure and the drift region; and a source contact structure extending through the trench and contacting the source region below the trench.

* * * * *